(12) United States Patent
Terui

(10) Patent No.: US 6,986,196 B2
(45) Date of Patent: Jan. 17, 2006

(54) ELECTRIC-COMPONENT SUPPLYING METHOD AND ELECTRIC-COMPONENT MOUNTING SYSTEM

(75) Inventor: Seiichi Terui, Anjo (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 301 days.

(21) Appl. No.: 10/241,518

(22) Filed: Sep. 12, 2002

(65) Prior Publication Data

US 2003/0051344 A1 Mar. 20, 2003

(30) Foreign Application Priority Data

Sep. 20, 2001 (JP) .......................... 2001-287339

(51) Int. Cl.
*B23P 19/00* (2006.01)

(52) U.S. Cl. ............................ 29/740; 29/739; 29/743
(58) Field of Classification Search ............... 29/739, 29/740, 741, 743, 748, 759
See application file for complete search history.

(56) References Cited

U.S. PATENT DOCUMENTS

| | | | | |
|---|---|---|---|---|
| 5,040,291 A | * | 8/1991 | Janisiewicz et al. | 29/840 |
| 5,867,897 A | * | 2/1999 | Mimura et al. | 29/840 |
| 6,094,808 A | * | 8/2000 | Mimura et al. | 29/743 |
| 6,467,670 B2 | * | 10/2002 | Higashi et al. | 228/1.1 |

FOREIGN PATENT DOCUMENTS

| | | |
|---|---|---|
| JP | 5-198992 | 8/1993 |
| JP | A 7-15181 | 1/1995 |
| JP | A 2001-68893 | 3/2001 |

* cited by examiner

*Primary Examiner*—Carl J. Arbes
(74) *Attorney, Agent, or Firm*—Oliff & Berridge, PLC

(57) ABSTRACT

A method of supplying suction nozzles with electric components supplied from feeders each of which is operable to feed the electric components to its component-supply portion and which are arranged in a direction intersecting a direction of feeding of the components, the suction nozzles being held by nozzle holders supported by a movable member and arranged in the direction arrangement of the feeders, the movable member being movable to permit each suction nozzle to hold the component by suction, wherein a distance between axes of adjacent ones of the selected suction nozzles in the direction of arrangement of the feeders is adjusted, and/or a component-supply position of each feeder at which the component is located after each feeding action of the feeder is adjusted, so that the selected suction nozzles are aligned with the components at the component-supply positions, and the selected suction nozzles are operated to simultaneously hold the components located at the component-supply positions. Also disclosed is an electric-component mounting system operable to practice the method and mount the electric components on a circuit substrate.

16 Claims, 20 Drawing Sheets

ELECTRIC-COMPONENT SUPPLYING METHOD AND ELECTRIC-COMPONENT MOUNTING SYSTEM

The present application is based on Japanese Patent Application No. 2001-287339 filed Sep. 20, 2001, the content of which is incorporated herein by reference.

BACKGROUND OF THE INVENTION

1. Field of the Invention

The present invention relates in general to a method of supplying electric components and an electric-component mounting system arranged to mount the electric components, and more particularly to improvements in the accuracy with which a component-mounting unit of the electric-component mounting system receives the electric components from a feeder of a component-supplying device of the system.

2. Discussion of Related Art

One example of an electric-component mounting system is provided with a component-supplying device including a plurality of feeders each operable to feed a succession of electric components (typically, electronic components), and a component-mounting device including a suction nozzle operable to receive the electric components from a component-supply portion of a selected one of the feeders. The plurality of feeders are arranged in a direction perpendicular to the direction of feeding of the electric components by each feeder. Where the component-mounting device includes a plurality of suction nozzles, a plurality of electric components can be simultaneously received and held by suction by the respective suction nozzles, so that the component-mounting device can be supplied with the electric components with improved efficiency. For instance, the suction nozzles are fixedly disposed on a single movable member such that the suction nozzles are equally spaced from each other in the direction of arrangement of the feeders, by a spacing interval equal to a multiple of a spacing interval of the feeders. The spacing interval of the suction nozzles is equal to a distance between the axes of the adjacent suction nozzles, while the spacing interval of the feeders is equal to a distance between the component-supply portions of the adjacent feeders. In this arrangement, the plurality of suction nozzles can be concurrently aligned with the component-supply portions of the respective feeders, so that the electric components can be simultaneously held by suction by the respective suction nozzles located at the positions aligned with the component-supply portions.

In some electric-component mounting systems, the component-supply portions of the plurality of feeders are not equally spaced apart from each other in the direction of arrangement of the feeders. In these systems, the plurality of suction nozzles of the component-mounting device cannot be simultaneously aligned with the component-supply portions of the respective feeders, so that the electric components fed to the component-supply portions cannot be simultaneously received by the respective suction nozzles. Further, the suction nozzles may be misaligned with respect to the respective component-supply portions of the feeders, due to variations in the distance between the axes of the adjacent suction nozzles and the distance between the component-supply portions of the adjacent feeders, which variations may arise from errors in the manufacture and assembling of the suction nozzles and the feeders. In this case, the electric components supplied from the feeders cannot be held by suction by the respective suction nozzles, or the electric components held by the suction nozzles cannot be accurately centered with respect to the sucking surface of each suction nozzle, leading to instability of holding of the electric components by the suction nozzles.

SUMMARY OF THE INVENTION

The present invention was made in view of the problems encountered in the prior art described above. It is therefore an object of the present invention to an electric-component supplying method, an electric-circuit fabricating method and an electric-component mounting system, which permits stable simultaneous holding of a plurality of electric components by suction by respective suction nozzles. This object may be achieved according to any one of the following modes of the present invention, in the form of an electric-component supplying method, an electric-circuit fabricating method or an electric-component mounting system, each of which is numbered like the appended claims and depends from the other mode or modes, where appropriate, for easier understanding of technical features disclosed in the present application and possible combinations of those features. However, it is to be understood that the invention is not limited to those technical features or combinations thereof, and that any one of a plurality of technical features described below with respect to any one mode of the invention may be a subject of the present invention, without the other technical feature or features being combined with the above-indicated one feature.

(1) A method of supplying a plurality of suction nozzles with respective electric components located at respective component-supply portions of a plurality of feeders each of which is operable to feed the electric components to its component-supply portion one after another and which are arranged in a direction intersecting a direction of feeding of the electric components, the suction nozzles being held by respective nozzle holders which are supported by a movable member and arranged in the direction in which the feeders are arranged, the movable member being movable to permit each of the suction nozzles to hold a corresponding one of the respective electric components by suction under a negative pressure, wherein the method comprising;

at least one of (a) a step of adjusting a distance between axes of adjacent ones of selected ones of the plurality of suction nozzles in the direction in which the feeders are arranged, and (b) a step of adjusting a component-supply position of each of the feeders at which the corresponding one of the respective electric components is located after each feeding action of each feeder; and a step of operating the selected ones of the plurality of suction nozzles to simultaneously hold the respective electric components located at the component-supply positions of the corresponding feeders, after the selected suction nozzles are aligned with the respective electric components located at the component-supply positions, as a result of the above-indicated at least one of the steps of adjusting.

The plurality of suction nozzles may be arranged such that the distance between the axes of the adjacent suction nozzles in the direction of arrangement of the feeders are adjustable for all of the suction nozzles, or for only the selected ones of the suction nozzles. In the former case, the distance between the axes of the adjacent suction nozzles may be adjusted for all of the plurality of suction nozzles, to permit all of the suction nozzles to simultaneously hold the respective electric components by suction, or alternatively, the distance is adjusted for only the selected ones of the suction nozzles, to permit only the selected suction nozzles to simultaneously hold the respective electric components by suction. In the latter case, the distance between the axes of the adjacent suction nozzles may be adjusted for all of the selected suction nozzles, or for only some of the selected suction nozzles.

By adjusting the distance between the adjacent ones of the selected suction nozzles in the direction of arrangement of the feeders, the positions of the selected suction nozzles can be aligned with the respective components at the component-supply positions in the direction of arrangement of the feeders, so that the electric components can be simultaneously held by suction by the selected suction nozzles, with a high degree of stability, even where the distance between the component-supply portions of the adjacent feeders is not constant for all of the feeders, or even in the presence of a variation or error in the distance between the axes of the adjacent suction nozzles and/or the distance between the component-supply portions of the adjacent feeders, with respect to the nominal value.

By adjusting the component-supply position of each feeder at which the corresponding electric component is located after each feeding action of the feeder, the positions of the selected suction nozzles can be aligned with the respective electric components at the component-supply positions in the direction of feeding of the electric components, so that the electric components can be simultaneously held by suction by the selected suction nozzles with high stability, even in the presence of an error in the component-supply position or positioning errors of the suction nozzles in the feeding direction. The accuracy of holding of the electric components by the suction nozzles can be improved by adjusting at least one of the distance between the axes of the adjacent ones of the selected suction nozzles and the component-supply positions of the feeders. However, it is desirable to adjust both of the distance and the component-supply positions, for further improving the accuracy of holding of the electric components by the suction nozzles, particularly where the electric components have comparatively small sizes.

(2) A method according to the above mode (1), wherein each of the plurality of feeders is arranged to feed a carrier tape in a longitudinal direction thereof, the carrier tape holding a succession of electric components arranged in the longitudinal direction, and the component-supply position of each feeder is adjusted by adjusting a position at which a feeding movement of the carrier tape in a direction toward the component-supply portion is stopped upon each feeding action of the feeder.

For example, the carrier tape includes a substrate having a multiplicity of component-accommodating recesses, which are arranged in a row extending in the longitudinal direction of the carrier tape and which accommodate the respective electric components. The carrier tape further includes a covering tape bonded to the substrate so as to close the openings of the component-accommodating recesses. Alternatively, the carrier tape holds the electric components at their lead wires, such that the electric components are arranged in a row extending in the longitudinal direction.

(3) A method according to the above mode (1) or (2), wherein each of the plurality of suction nozzles includes a fixing portion at which the suction nozzle is held by the nozzle holder, and a sucking portion arranged to hold the electric component by suction and eccentric with respect to the fixing portion, and the distance between the axes of the adjacent ones of the selected ones of the plurality of suction nozzles is adjusted by rotating the nozzle holders corresponding to the selected suction nozzles.

In the method according to the above mode (3), the "distance between the axes of the adjacent ones of the selected ones of the plurality of suction nozzles" referred to above with respect to the above mode (1) is the distance between the axes of the sucking portions of the adjacent ones of the selected suction nozzles.

The eccentric relationship between the fixing portion and the sucking portion of the suction nozzle permits the center or axis of the sucking portion to be turned about the axis of rotation of the nozzle holder when the nozzle holder is rotated at its axis. This turning movement of the sucking portion causes a change of its position in the direction of arrangement of the feeders, permitting the adjustment of the distance between the axis of the sucking portion of the suction nozzle in question and the axis of the suction portion of the adjacent nozzle.

In some systems including the suction nozzles including the mutually eccentric fixing and sucking portions, a nozzle-holder rotating device is provided to rotate the nozzle holder for rotating the suction nozzle to rotate the electric component held by the suction nozzle, for the purpose of eliminating an angular positioning error of the electric component as held by the suction nozzle (an angular positioning error of the electric component about the axis of rotation of the sucking portion of the suction nozzle which is perpendicular to a sucking end face of the sucking portion on which the electric component is held by suction). In this case, each nozzle holder can be rotated by this nozzle-holder rotating device, to adjust the distance between the axes of the sucking portions of the adjacent suction nozzles. Thus, the adjustment can be achieved easily and economically.

(4) A method according to the above mode (1) or (2), wherein selected ones of the nozzle holders which correspond to the selected ones of the plurality of suction nozzles are held by the movable member such that a distance between axes of adjacent ones of the selected nozzle holders is adjustable, and the distance between the axes of the adjacent ones of the selected ones of said plurality of suction nozzles is adjusted by adjusting the distance between the axes of the adjacent ones of the selected nozzle holders.

(5) A method according to any one of the above modes (1)–(4), wherein each of the plurality of feeders includes a component feeding device operable to feed the electric components, the component feeding device including an electric motor as a drive source, and the component-supply position of each feeder is adjusted by controlling an angular position of the electric motor at which an operation of the electric motor is stopped upon each feeding action of the feeder.

The component feeding device including the electric motor as its drive source is provided for each of the feeders, and the component-supply position of each feeder can be adjusted by adjusting the angular position of the electric motor at which the operation of the electric motor is stopped upon each feeding action of the feeder.

The component-supply position at which the electric component is located after each feeding action of the feeder can be easily adjusted by controlling the angle of operation of the electric motor. The electric motor serving as the drive source of the component feeding device may be provided outside the body of the feeder, which includes a feeding mechanism operable by the electric motor to feed the electric components. In this case, the drive sources and the feeders may be disposed such that the drive sources and the feeders are movable relative to each other in the direction of arrangement of the feeders, so that each feeder is driven by an appropriate one of the drive sources. Alternatively, a single drive source may be used for the plurality of feeders. In this latter case, the feeding mechanism incorporated in each feeder may include a mechanism arranged to adjust the component-supply position of the feeder.

(6) A method according to any one of the above modes (1)–(6), further comprising a position detecting step of detecting at least one of a first position of the component-supply portion of each feeder in the direction of arrangement of the plurality of feeders, and a second position of the component-supply portion in the direction of feeding of the electric components as the component-supply position, and wherein the selected suction nozzles are aligned with the respective electric components, on the basis of the above-indicated at least one of the first and second positions of the component-supply portion which has been detected in the position detecting step.

At least one of the first and second positions of the component-supply portion of each feeder in the direction of arrangement of the feeders and in the direction of feeding of the electric components may be detected by operating a recognition device to recognize a fiducial mark provided near the component-supply portion of the feeder, or at least one of the electric components held by a carrier tape. Alternatively, the recognition device may be operated to recognize a gauge tape set on each feeder, for detecting at least one of the first and second positions of the component-supply portion of each feeder.

The gauge tape may be a tape separate from the carrier tape, or a portion of the carrier tape. In the latter case, the leading end portion of the carrier tape functions as the gauge tape. This leading end portion may be provided with a suitable fiducial mark or pattern formed by printing. Alternatively, a label or any other suitable medium having a fiducial mark or pattern is spliced to the leading end of the carrier tape.

The stability of holding of the electric components by suction by the suction nozzle can be improved by aligning the suction nozzles with the electric components so as to reduce positioning errors of the component-supply portion of each feeder due to manufacturing and positioning errors of the feeder, on the basis of the detected first position of the component-supply portion in the direction of arrangement of the feeders, and/or the detected second position of the component-supply portion in the feeding direction of the feeder, that is, the component-supply position determined by each feeding action of the feeder.

(7) A method according to any one of the above modes (1)–(6), further comprising a sucking-position detecting step of detecting a position of a sucking portion of each of the selected ones of the plurality of suction nozzles, which sucking portion is arranged to hold the corresponding electric component, and wherein the selected suction nozzles are aligned with the respective electric components, on the basis of at least the position of the sucking portion of each elected suction nozzle detected in the sucking-position detecting step.

The stability of holding of the electric components by suction by the suction nozzle can be improved by aligning the suction nozzles with the electric components so as to reduce positioning errors of the sucking portion of each selected suction nozzle due to manufacturing and positioning errors of the suction nozzle, on the basis of the detected position of the sucking portion of the suction nozzle.

(8) A method of fabricating an electric circuit by mounting electric components at respective component-mounting spots on a circuit substrate, the method comprising a method of supplying a plurality of suction nozzles with the respective electric components according to any one of the above modes (1)–(7).

In the electric-circuit fabricating method according to the above mode (8), the plurality of electric components are simultaneously held by the respective suction nozzles, so that the electric circuit can be fabricated with high efficiency owing to an efficient operation of the suction nozzles for simultaneous holding of the plurality of electric components.

(9) An electric-component mounting system for mounting electric components on a circuit substrate, comprising:

a circuit-substrate holding device operable to hold the circuit substrate;

a feeder holding device which holds a plurality of feeders each operable to feed the electric components in a row to a component-supply portion thereof one after another, such that the electric components are fed by each of the feeders in a feeding direction parallel to a first straight line on a reference plane parallel to a component-mounting surface of the circuit substrate as held by the circuit-substrate holding device, and such that the component-supply portions of the feeders are arranged in a direction parallel to a second straight line on the reference plane, which second straight line intersects the first straight line;

a movable member which holds a plurality of suction nozzles such that the suction nozzles are arranged in the direction of arrangement of the plurality of feeders and such that each of the suction nozzles is rotatable about an axis of rotation thereof perpendicular to the reference plane, the movable member being movable in the reference plane;

at least one of (a) a spacing-distance adjusting device operable to adjust a distance between axes of adjacent ones of selected ones of the plurality of suction nozzles in the direction of arrangement of the plurality of feeders, and (b) a component-supply-position adjusting device operable to adjust a component-supply position of each of the feeders at which one of the electric components in the row is located in the component-supply portion in the feeding direction after each feeding action of each feeder; and a component-holding control device operable to control the above-indicated at least one of the spacing-distance adjusting device and the component-supply-position adjusting device, for adjusting at least one of a first relative position in the feeding direction and a second relative position in the direction of arrangement of the feeders, between each of the selected suction nozzles and the electric component located in the component-supply portion of the feeder corresponding to each selected suction nozzle, so as to permit the selected suction nozzles to simultaneously hold by suction the respective electric components located in the respective component-supply portions of the feeders corresponding to the selected suction nozzles.

The first and second straight lines indicated above, that is, the direction of feeding of the electric components by the feeders and the direction of arrangement of the feeders and the suction nozzles are desirably perpendicular to each other.

Examples of the circuit substrate include: a printed-wiring board on which no electric components have been mounted at any spots of a printed wiring formed on an electrically insulating substrate; a printed-wiring board on which electric components have been mounted at selected ones of the spots of the printed wiring and on which electric components are to be mounted at the other spots; and a printed-circuit board on which electric components have been mounted on one of its opposite surfaces with printed wirings formed thereof, and on which electric components are to be mounted on the other surface.

The plurality of suction nozzles are moved relative to the plurality of feeders, and the selected suction nozzles are operated to simultaneously hold the respective electric components by suction. The stability of simultaneously holding of the electric components by the selected suction nozzles can be improved owing to at least one of the adjustment of the distance between the axes of the adjacent ones of the selected suction nozzles and the adjustment of the component-supply positions of the corresponding feeders, as described above with respect to the above form (1) of this invention. The feeders from which the electric components are simultaneously supplied to the respective suction nozzles may be adjacent to each other, or all or some of those feeders may be spaced from each other by the other feeder or feeders not used for supplying the electric components.

The suction nozzles holding the respective electric components are moved with the movable member, to respective positions above the predetermined component-mounting spots on the circuit substrate, and then the suction nozzles are lowered to mount the electric components at the respective component-mounting spots on the circuit substrate. Before the electric components are mounted on the circuit substrate, or during the movements toward the component-mounting spots on the circuit substrate, each suction nozzle may be rotated to eliminate an angular positioning-error of the electric component as held by the suction nozzle, and to change the angular position if the angular position in which the electric component is mounted on the circuit substrate is different from the angular position in which the electric component has been held by the suction nozzle.

(10) An electric-component mounting system according to the above mode (9), wherein each of the plurality of feeders includes a component feeding device operable to feed the electric components, the component feeding device including as a drive source an electric motor an angular position of which is controllable, and the component-supply-position adjusting device including an electric-motor control device operable to control the angular position of the electric motor at which an operation of the electric motor is stopped, whereby the component-supply position of each feeder is adjusted.

The electric motor of the component feeding device may be a servomotor or a stepping motor.

Since the electric motor whose angular position is controllable is used as the drive source of the component feeding device, the component-supply position of each feeder can be easily adjusted.

(11) An electric-component mounting system according to the above mode (9) or (10), wherein each of the plurality of feeders includes a tape-feeding device operable to feed a carrier tape in a longitudinal direction thereof, the carrier tape holding a succession of electric components arranged in the longitudinal direction.

(12) An electric-component mounting system according to any one of the above modes (9)–(11), wherein the movable member holds a plurality of nozzle holders such that the nozzle holders are arranged in the direction of arrangement of the plurality of feeders and such that each of selected ones of the plurality nozzle holders is rotatable about an axis of rotation thereof perpendicular to the reference plane, and wherein the spacing-distance adjusting device includes a plurality of nozzle-holder rotating devices operable to rotate the selected ones of the nozzle holders independently of each other to respective desired angular positions thereof.

The suction nozzle are rotated together with the corresponding nozzle holders. Where the suction nozzle includes a fixing portion at which the suction nozzle is held by the nozzle holder, and a sucking portion which is operable to hold the electric component and which is eccentric with respect to the fixing portion, a rotary motion of the nozzle holder causes the sucking portion of the suction nozzle to be turned about the axis of rotation of the nozzle holder, so that the position of the sucking portion relative to the axis of rotation of the nozzle holder is changed, whereby the distance between the axes of the adjacent suction nozzles can be changed, that is, the distance between the centers of the sucking portions of the adjacent suction nozzles can be adjusted.

The suction nozzle may be designed such that its sucking portion of the suction nozzle is eccentric with respect to its fixing portion. However, where the sucking portion has a certain amount of eccentricity with respect to the fixing portion due to a manufacturing error of the suction nozzle, or due to bending of the sucking portion in the form of a suction tube, this eccentricity can be utilized to adjust the distance between the axes of the adjacent suction nozzles. In this case, the error of relative positioning between the suction nozzle and the corresponding feeder in the direction of arrangement of the feeders may not be completely eliminated. In this event, the suction nozzle is rotated with the corresponding nozzle holder to an angular position at which the amount of reduction of the relative positioning error indicted above can be minimized.

(13) An electric-component mounting system according to any one of the above modes (9)–(11), wherein the movable member holds a plurality of nozzle holders for holding the plurality of suction nozzles, respectively, such that the nozzle holders are arranged in the direction of arrangement of the plurality of feeders and such that selected ones of the nozzle holders which correspond to the selected ones of the plurality of suction nozzles are movable in the direction of arrangement, and wherein the spacing-distance adjusting device includes a nozzle-holder moving device operable to move the selected ones of the nozzle holders in the direction of arrangement, for thereby adjusting a distance between axes of adjacent ones of the selected ones of the nozzle holders.

In the electric-component mounting system according to the above mode (13), the distance between the axes of the adjacent selected suction nozzles can be adjusted by adjusting the distance between the centers of the sucking portions of the adjacent selected suction nozzles, without an eccentric arrangement of the sucking portion of each selected suction nozzle with respect to its fixing portion, and without a displacement of the sucking portion in the feeding direction, which would take place where the suction nozzle having the eccentric arrangement is rotated with the corresponding nozzle holder to adjust the distance between the axes of the adjacent suction nozzles.

(14) An electric-component mounting system according to any one of the above modes (9)–(13), further comprising:

a component-supply-portion recognizing device operable at a predetermined position thereof to recognize the component-supply portion of each feeder and a portion surrounding the component-supply portion; and a component-supply-position obtaining device operable on the basis of at least an output signal of the componentsupply-portion recognizing device, to obtain at least one of a first position of the component-supply portion of each feeder in the direction of arrangement of the plurality of feeders, and a second position of the component-supply portion in the feeding direction as the component-supply position, and wherein the component-holding control device is operable to adjust the above-indicated at least one of the first and second relative positions between each of the selected suction nozzles and the electric component located in the component-supply portion of the corresponding feeder, on the basis of at least the above-indicated at least one of the first and second positions which has been obtained by the component-supply-position obtaining device.

The component-supply-portion recognizing device may be constituted by an imaging device, for example. The imaging device may be a surface-imaging device capable of taking a two-dimensional image of an object at one time, or may be a line sensor which includes a straight array of a multiplicity of imaging elements or photosensitive elements and which is moved relative to the object to take successive lines of images that collectively define a two-dimensional image of the object.

The electric-component mounting system according to the above mode (14) has substantially the same advantage as the method according to the above mode (6).

(15) An electric-component mounting system according to any one of the above modes (9)–(14), further comprising:

a sucking-portion recognizing device operable at a predetermined position thereof to recognize a sucking portion of each of the selected ones of the plurality of suction nozzles, which sucking portion is arranged to hold the corresponding electric component; and a sucking-position obtaining device operable on the basis of at least an output signal of the sucking-portion recognizing device, to obtain a position of the sucking portion, and wherein the component-holding control device is operable to adjust the above-indicated at least one of said first and second relative positions between each of the selected suction nozzles and the electric component located in the component-supply portion of the corresponding feeder, on the basis of at least the position of the sucking portion obtained by the sucking-position obtaining device.

The sucking-portion recognizing device may be constituted by an imaging device as described above, for example. The electric-component mounting system according to the above mode (15) has substantially the same advantage as the method according to the above mode (7).

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
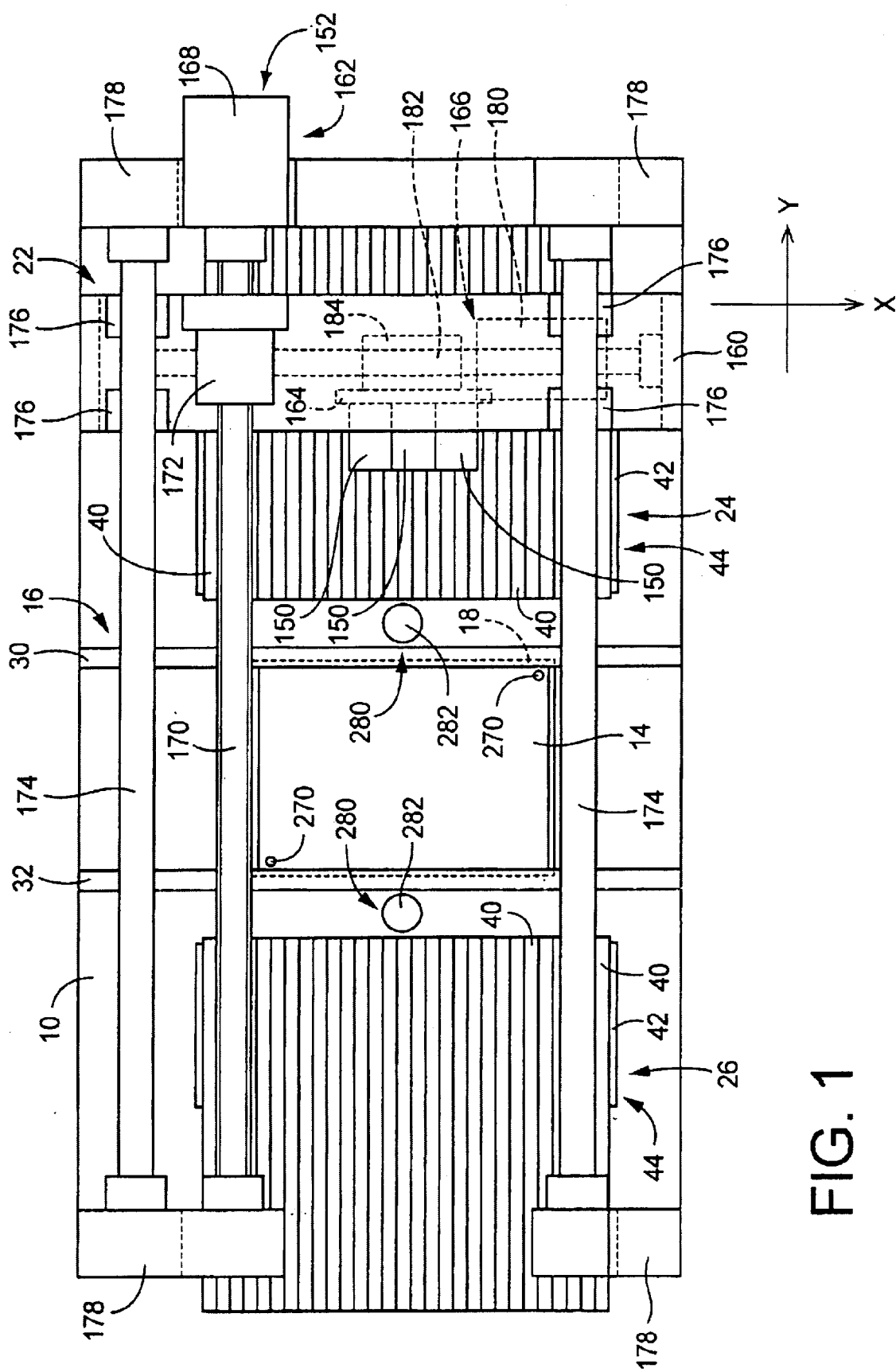
FIG. 1 is a top plan view schematically showing an electronic-component mounting system constructed and operable to make a search for a fiducial mark according to one embodiment of this invention.
Figure 3:
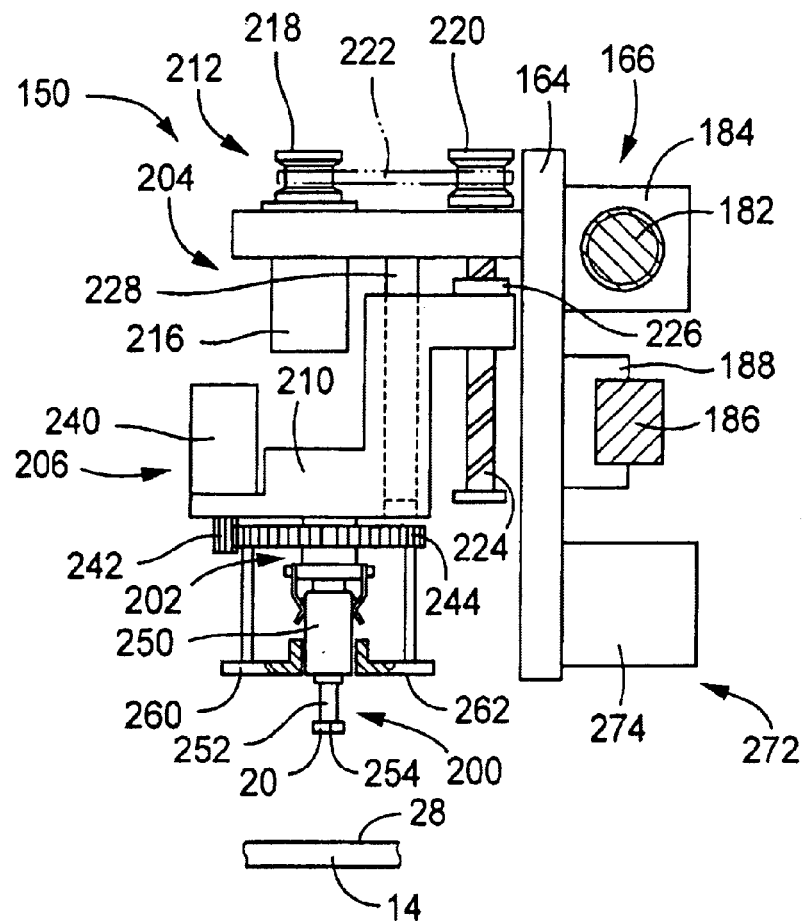
FIG. 3 is a front elevational view partly in cross section of a component-mounting device in the electric-component mounting system.

Referring first to FIG. 1, there is shown an electric-component mounting system constructed according to one embodiment of this invention. In FIG. 1, reference sign 10 denotes a machine base serving as a main body of the system. On the machine base 10, there are mounted a printed-wiring-board conveyor (PWB conveyor) 16, a circuit-substrate holding device in the form of a printed-wiring-board holding device (PWB holding device) 18, a component-mounting device 22, and two component-supplying device 24, 26. The PWB conveyor 16 is arranged to feed or transfer a circuit substrate in the form of a printed-wiring board 14, and the PWB holding device 18 is arranged to hold the printed-wiring board 14. The component-mounting device 22 is arranged to mount electric components in the form of electronic components 20 (one of which is shown in FIG. 3) on the printed-wiring board 14, and the component-supplying devices 24, 26 are arranged to supply the component-mounting device 22 with the electronic components 20.

As schematically shown in FIG. 1, the PWB conveyor 16 is provided with a pair of guide rails 30, 32 on which respective endless conveyor belts (not shown) are wound, so that the printed-wiring board 14 placed on the conveyor belts is transferred or fed by synchronous rotary motions of the conveyor belts by a belt driving device (not shown).

In the present electronic-component mounting system, the printed-wiring board 14 is fed by the PWB conveyor 16 such that the board 14 maintains a horizontal attitude, and is stopped by a suitable stopper device (not shown) at a predetermined working position. The printed-wiring board 14 stopped at the working position is held by the PWB holding device 18 disposed at a position corresponding to the working position. In the present embodiment, the printed-wiring board 14 is held by the PWB holding device 18 such that an upper component-mounting surface 28 (shown in FIG. 2) of the board 14 on which the electric components 20 are to be mounted is kept parallel to the horizontal plane.

The present electronic-component mounting system has an XY coordinate system wherein an XY plane defined by the mutually perpendicular X and Y axes is parallel to the horizontal plane, namely, parallel to the component-mounting surface 28 of the printed-wiring board 14. The Y axis defines a first straight line in the XY plane, while the X axis defines a second straight line in the XY plane, which intersects the first straight line and along which the printed-wiring board 14 is fed by the PWB conveyor 16, in the present embodiment.

Figure 2:
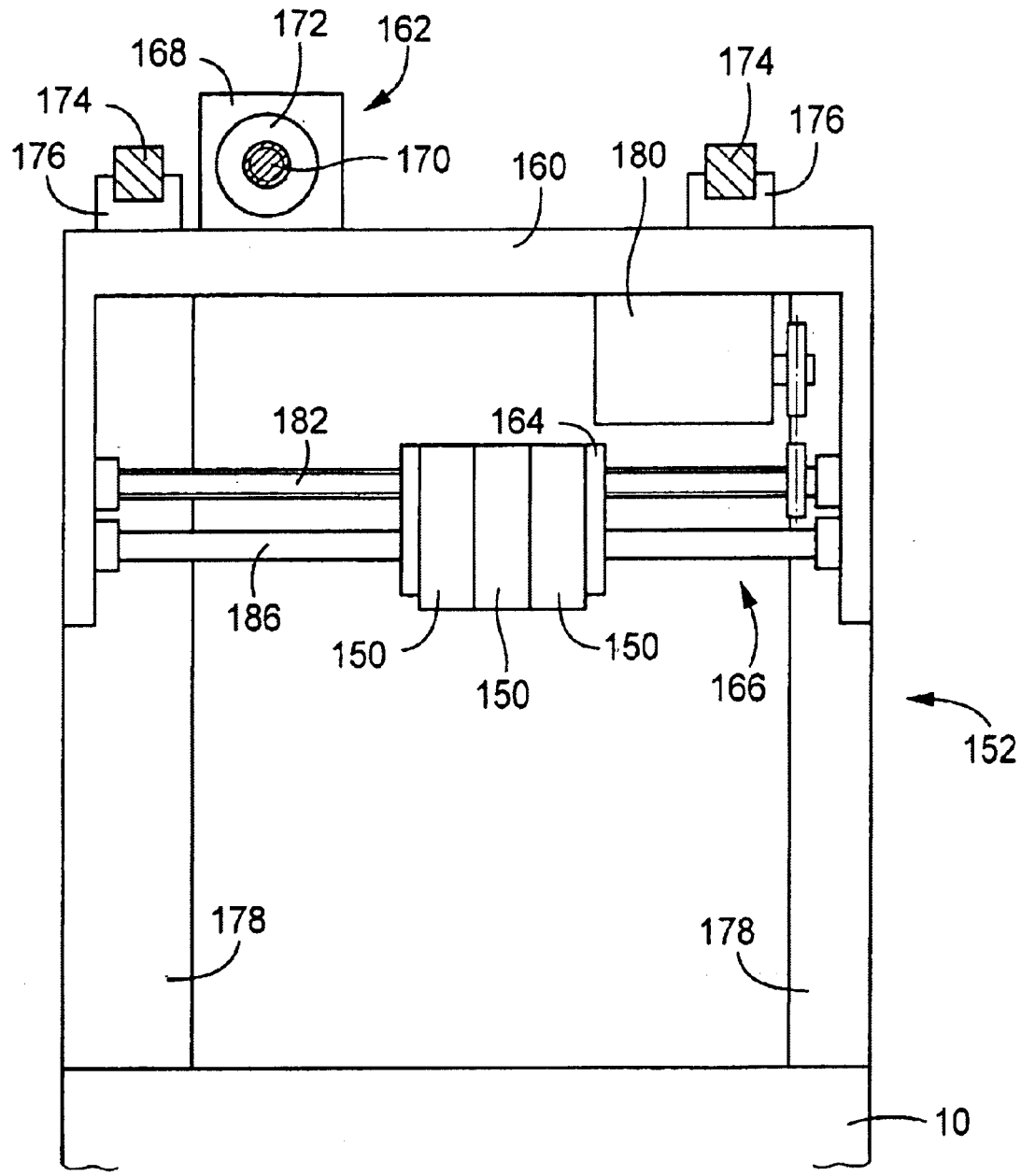
FIG. 2 is a side elevational view of the electronic-component mounting system of FIG. 1.

As shown in FIGS. 1 and 2, the two component-supplying devices 24, 26 are fixedly disposed on the respective opposite side of the PWB conveyor 16, such that the component-supplying devices 24, 26 are spaced apart from each other in the Y-axis direction, that is, along the above-indicated first straight line. Both of the two component-supplying devices 24, 26 are of a feeder type, and are identical in construction with each other. The construction of the component-supplying device 24 will be described by way of example. This construction is substantially the same as that of a component-supplying device disclosed in JP-A-10-112598.

Figure 6:
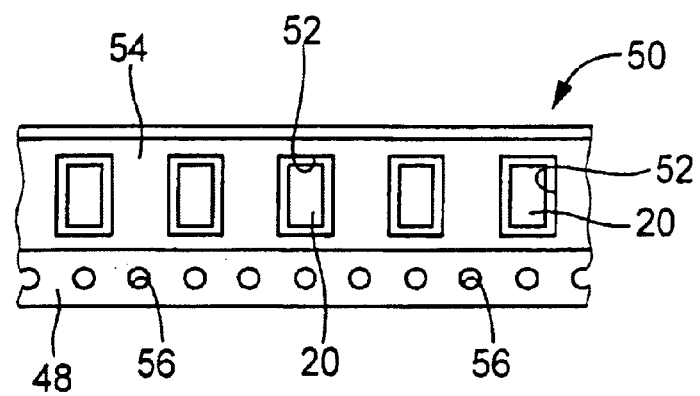
FIG. 6 is a plan view of a carrier tape to be set in each of the feeders described above.
Figure 7:
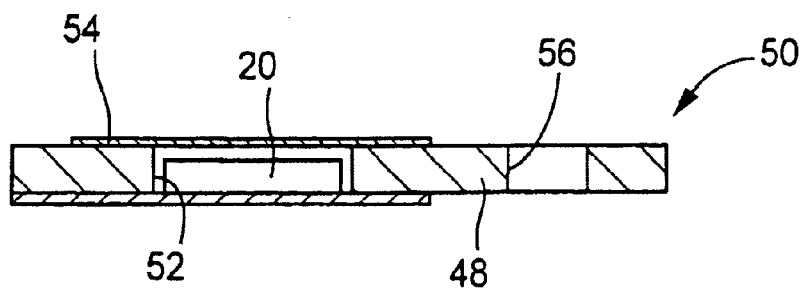
FIG. 7 is a side elevational view in cross section of the carrier tape.

The component-supplying device 24 has a component-supply table 44 provided with a support block 42 on which there are disposed a multiplicity of component feeders in the form of tape feeders 40. Each of the tape feeders 40 is arranged to feed a carrier tape 50 which includes a substrate 48 accommodating the electronic components 20, as shown in FIGS. 6 and 7.

The substrate 48 is a long strip having a multiplicity of component-accommodating recesses 52 formed therein such that the recesses 52 are equally spaced apart from each other in the longitudinal direction of the substrate 48, and arranged in a straight row. The electronic components 20 are accommodated in the respective recesses 52, as shown in FIG. 6, and the openings of the recesses 52 are closed by a covering tape 54 bonded to the substrate 48, as shown in FIGS. 6 and 7, so that the electronic components 20 are prevented from being removed out of the recesses 52 during feeding of the carrier tape 50. Thus, the carrier tape 50 holds a succession of electronic components 20 with a predetermined spacing pitch equal to the spacing pitch of the component-accommodating recesses 52, which is considered to be a feeding pitch of the carrier tape 50. The substrate 48 has a multiplicity of feed holes or perforations 56 formed along one of its opposite sides such that the feed holes 56 are equally spaced apart from each other in the longitudinal direction of the substrate 48. A roll of the carrier tape 50 is set in the tape feeder 40, more precisely, mounted on a supply reel 58 serving as a component storage member.

Figure 5:
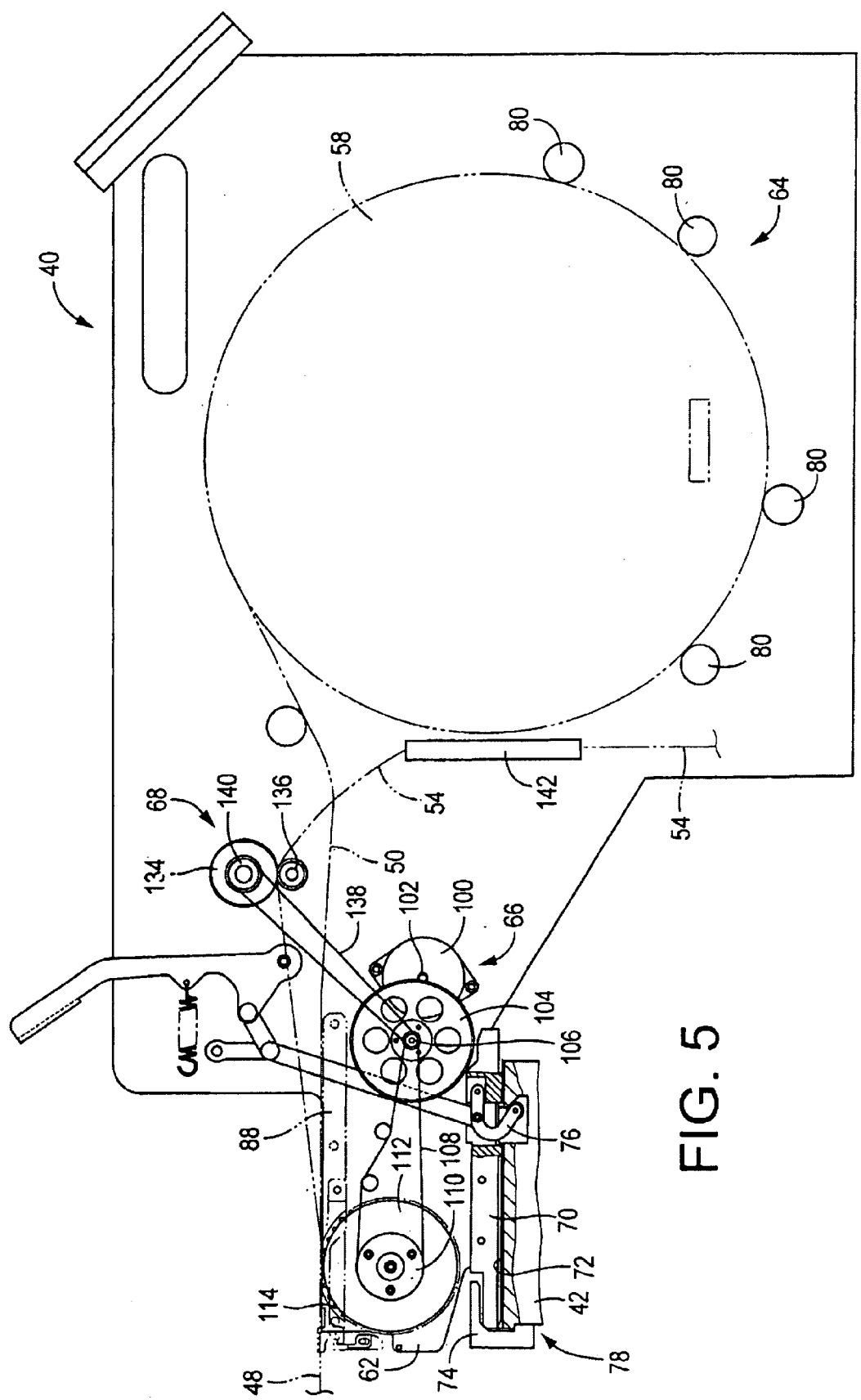
FIG. 5 is a front elevational view partly in cross section showing one of feeders disposed on a support block of a component-supplying device provided in the electronic-component mounting system.

Each feeder 40 includes a feeder body 62, a component-storage holding device or tape holding device in the form of a reel holding device 64, a tape feeding device in the form of a carrier-tape feeding device 60, and a covering-tape removing device 68. As shown in FIG. 5, the feeder 40 has a generally elongate positioning member 70 fitted in an engaging groove 72 formed in the support block 42, such that the positioning member 70 extends in the Y-axis direction and is positioned by the groove 72 in its direction of width, that is, in the X-axis direction. The positioning member 70 is further positioned in its longitudinal direction or the Y-axis direction, in engagement with an engaging member 74 and a clamping lever 76, such the positioning member 70 is clamped in place by the engaging member 74 and the clamping lever 76 when the clamping lever 76 is placed in its locking position. The positioning member 70 can be removed from the engaging groove 72 (removed from the support block 42) by operating the clamping lever 76 to its unlocking position. In the present embodiment, the support block 42, engaging groove 72, engaging member 74 and clamping member 76 cooperate to constitute a feeder holding device 78. Each feeder 40 is held and positioned by the feeder holding device 78 such that the longitudinal direction of the feeder 40 is parallel in the Y-axis direction, and such that the feeders 40 are arranged in the X-axis direction, with their component-supply portions lying on a straight line parallel to the X-axis direction. To holder the plurality of feeders 40, a plurality of feeder holding devices 78 are provided on the support block 42 such that the feeder holding devices 78 are equally spaced apart from each other in the X-axis direction with a predetermined feeder-holding pitch which is a nominal distance in the X-axis direction between the component-supply portions of the two feeders 40 disposed adjacent to each other in the X-axis direction. In operation of the component-supplying device 24, however, all of the feeder holding devices 78 are not necessarily or always used to hold the respective feeders 40. That is, some feeders 40 which have comparatively large width dimensions in the X-axis direction are disposed on the support block 42 such that these feeders are spaced apart from each other in the X-axis direction by a distance two or more times the above-indicated feeder-holding pitch (nominal distance between the adjacent feeders 40).

The reel holding device 64 is provided with a plurality of rotary support members in the form of support rollers 80 each of which is rotatably supported by the feeder body 62. These support rollers 80 rotatably support the supply reel 58. A leading portion of the carrier tape 50 extending from the roll set in the supply reel 58 is passed to slide on a guide member 88 provided on the feeder body 62, and is fed by the carrier-tape feeding device 66 in the forward direction toward the PWB conveyor 16.

The carrier-tape feeding device 66, which function as a component feeding device for feeding the electric components 20, includes a stepping motor 100, a driving gear 102 rotatable by the stepping motor 100, a driven gear 104 rotatably supported by the feeder body 62 and meshing with the driving gear 102, a driving pulley 106 rotatable with the driving gear 102, a driven pulley 110 rotatably supported by the feeder body 62, a driving belt 108 connecting the driving and driven pulleys 106, 110, and a sprocket wheel 112 rotatable with the driven pulley 110. The sprocket wheel 112 has external teeth 114 engageable with the feed holes 56 formed in the carrier tape 50, so that the carrier tape 50 is fed in its longitudinal direction (in the longitudinal direction of the tape feeder 40) parallel to the Y-axis direction, when the sprocket wheel 112 is rotated by the stepping motor 100 through the gears 102, 104, pulleys 196, 110 and belt 108. As a result, a succession of electronic components 20 accommodated in the carrier tape 50 is fed such that the electronic component 20 are successively fed one after another to the component-supply portion of the feeder 40. The electronic components 20 are fed in the direction perpendicular to the direction in which the feeders 40 are arranged. It will be understood that the driving and driven gears 102, 104, driving and driven pulleys 106, 110 and driving belt 108 cooperate to constitute a rotation transmitting device operable to transmit a rotary motion of the stepping motor 100 to the sprocket wheel 112.

The stepping motor 100 is a rotary electric motor the operating amount or angle of which can be controlled with high accuracy, and functions as a drive source of the carrier-tape feeding device 66. The angle of operation of the stepping motor 100 is controlled according to a controlled pulse signal, to control the length of feeding of the carrier tape 50, so that the position at which each electronic component 20 is stopped after a feeding movement of the carrier tape 50 can be controlled. This position is a component supply position of the feeder 40 in the Y-axis direction. Namely, the component supply position of the feeder 40 in the Y-axis direction is controlled by controlling the angle of operation of the stepping motor 100.

Figure 8:
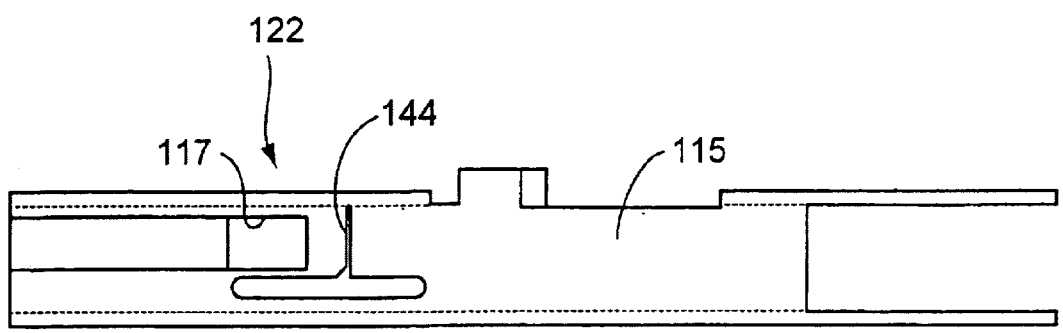
FIG. 8 is a plan view showing a covering member provided to cover the carrier tape in the feeder.

A portion of the carrier tape 50 which engages the sprocket wheel 112, and the adjacent leading and trailing portions of the carrier tape 50 are covered by or disposed above a covering member 115 (shown in FIG. 8), which prevents the substrate 48 from being moved upwards when the covering tape 54 is separated from the substrate 48. As shown in FIG. 8, the covering member 115 has an opening 117 through which each electronic component 20 is picked up by the component-mounting device 22. A portion of each tape feeder 40 in which the opening 117 is provided constitutes the component-supply portion indicated generally at 122 in FIG. 8.

Figure 9:
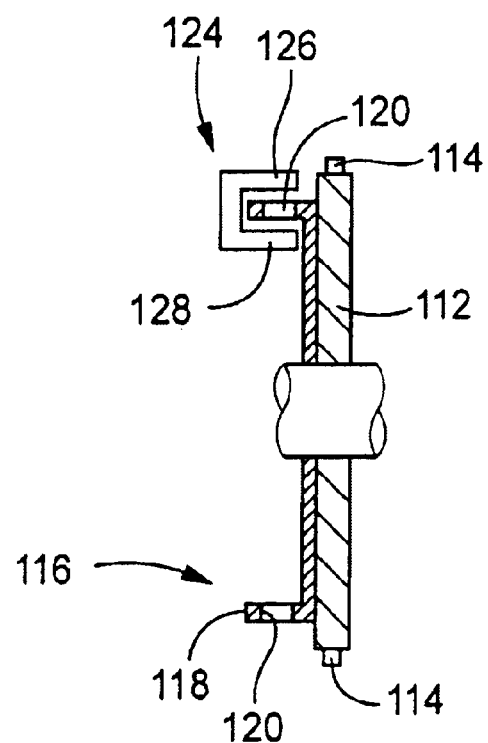
FIG. 9 is a side elevational view in cross section showing a sprocket wheel of a tape feeding device provided in the feeder.

As shown in FIG. 9, the sprocket wheel 112 carries a sensed member 116 fixed thereto such that the sensed member 116 is rotated with the sprocket wheel 112. The sensed member 116 is a cylindrical hollow member which is closed at one of its axial ends and open at the other axial end and which has a cylindrical wall 118 having a plurality of slits 120 formed therethrough such that the slits 120 are equiangularly spaced from other in the circumferential direction of the cylindrical wall 118. A spacing pitch of the slits 120 in the circumferential direction of the cylindrical wall 118 is equal to a multiple of the spacing pitch of the component-accommodating recesses 52 of the carrier tape 50 to be fed by the sprocket wheel 112 in question. Adjacent to the sensed member 116, there is fixedly disposed a detecting device in the form of a photoelectric sensor 124, which includes a light-emitting portion 126 and a light-receiving portion 128. In the photoelectric sensor 124, which is of a light-transmission type in the present embodiment, the light-emitting and light-receiving portions 126, 128 are disposed radially outwardly and inwardly of the cylindrical wall 118, respectively, such that these portions 126, 128 are opposed to each other in the radial direction of the cylindrical wall 118. When the sensed member 116 is rotated with the sprocket wheel 112, the light-receiving portion 128 receives a light emitted from the light-emitting portion 126 through one of the slits 120, which is aligned with the light-emitting and light-receiving portions 126, 128 in the circumferential direction of the cylindrical wall 1178. When none of the slits 120 are aligned with the light-emitting and light-receiving portions 126, 128 in the circumferential direction of the cylindrical wall 118, the light emitted from the light-emitting portion 126 is reflected by the cylindrical wall 118, and is not received by the light-receiving portion 128. The photoelectric sensor 124 generates an OFF signal when the amount of light received by the light-receiving portion 128 is not larger a predetermined threshold, and generates an ON signal when the amount of light becomes larger than threshold. That is, the sensor 124 is turned on when the amount of light received by the light-receiving portion 128 has exceeded the threshold.

The position of the photoelectric sensor 124 in the circumferential direction of the sprocket wheel 112 is adjustable. The photoelectric sensor 124 is adjusted so that the output signal of the sensor 124 is changed from the OFF signal to the ON signal when each component-accommodating recess 52 of the carrier tape 50 is located at the component-supply position predetermined within the component-supply portion 122, more precisely, within the area of the opening 117 formed through the covering member 115. This adjustment of the position of the photoelectric sensor 124 is made by the operator of the electric-component mounting system. For instance, the component-supply position is adjusted such that each component-accommodating recess 52 is located at a center of the opening 117, or such that each tooth 114 of the sprocket wheel 112 is located at a predetermined position within an elongate hole formed through the covering member 115.

As described above, the spacing pitch of the slits 120 in the circumferential of the sensed member 116 is equal to a multiple of the spacing pitch of the component-accommodating recesses 52 of the carrier tape 50. Where the spacing pitch of the slits 120 is equal to the spacing pitch of the recesses 52, for example, an operation of the stepping motor 100 by a predetermined amount corresponding to the spacing pitch of the component-accommodating recesses 52 of the carrier tape 50 causes a movement of the carrier tape 50 by a distance corresponding to the spacing pitch of the recesses 52, in the absence of a feeding error of the carrier-tape feeding device 66. In this case, therefore, the photoelectric sensor 124 is turned from the off state to the on state, that is, turned on each time the stepping motor 100 is operated by the predetermined amount to feed the carrier tape 50 by the distance corresponding to the spacing pitch of the recesses 52 or components 20.

However, the sprocket wheel 112 has some angular positioning error in its direction of rotation, since the sprocket wheel 112 is not directly connected to the stepping motor 100, but is connected to the stepping motor 100 through the above-described rotation transmitting device including the driving belt 108. The amount of this angular positioning error of the sprocket wheel 112 can be obtained on the basis of the actual amount or angle of operation of the stepping motor 100 when the operating state of the photoelectric sensor 124 is changed from the off state to the on state, and a nominal amount or angle of operation of the stepping motor 100 required to enable the photoelectric sensor 124 to be turned on. Where the nominal total angle of operation of the stepping motor 100 required to feed the carrier tape 50 by a distance equal to a multiple N of the spacing pitch of the recesses 52 or components 20 is represented by N•θMU, and the actual total angle of operation of the stepping motor 100 when the photoelectric sensor 124 is turned on is represented by θMN, a cumulative feeding error of the carrier tape 50 is equal to (N•θMU−θMN). The value "N" also represents the number of intermittent feeding actions of the carrier tape 50 by an incremental distance equal to the spacing pitch of the components 20. In the present embodiment, the actual angle of operation of the stepping motor 100 is detected on the basis of the number of pulses which are applied to the motor 100 and which are counted during an operation of the motor 100 according to the pulses. However, the angle of operation of the stepping motor 100 may be detected by an angular-motion detecting device such as a rotary encoder.

Figure 10:
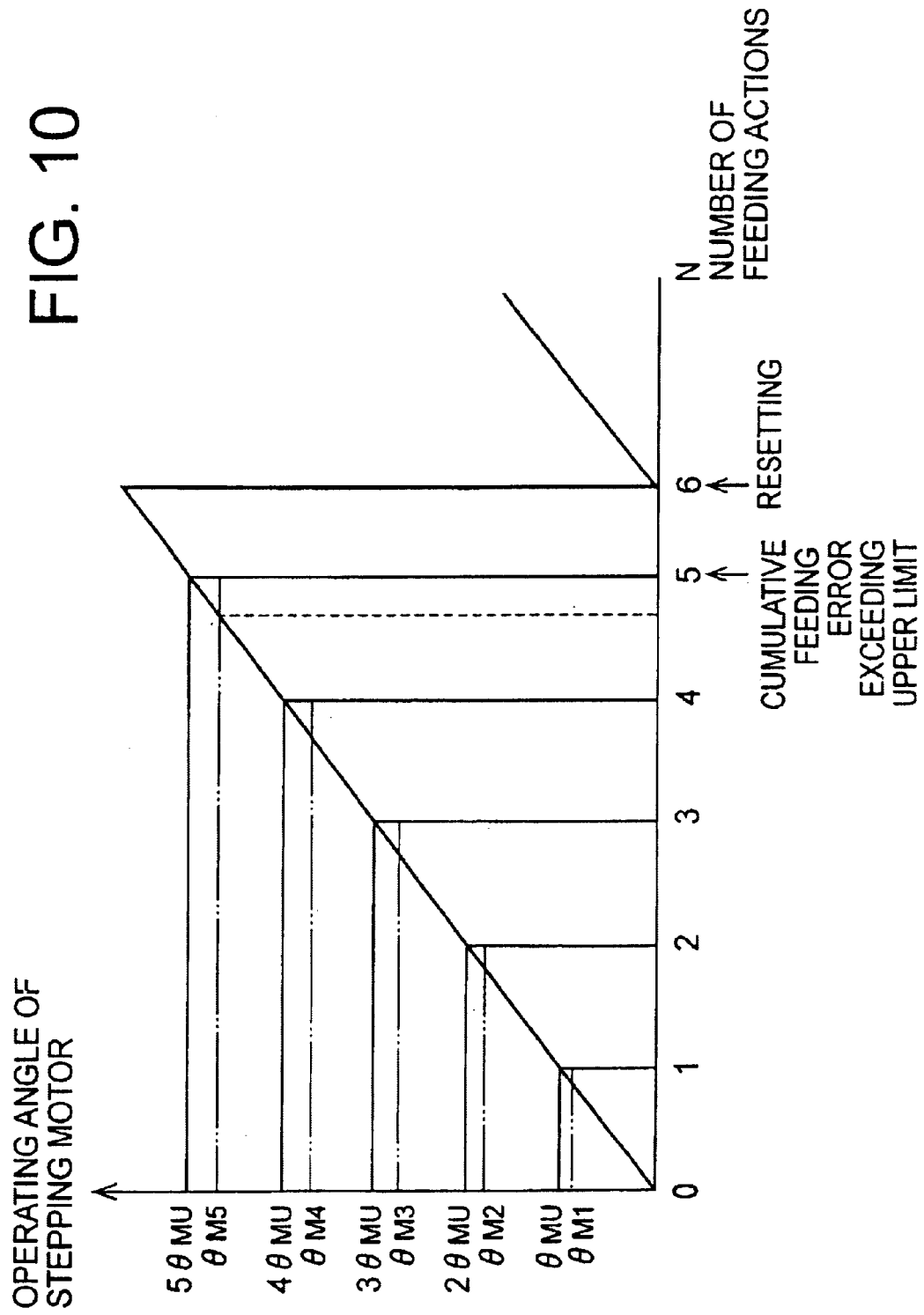
FIG. 10 is a graph for explaining an error of feeding of the carrier tape by the tape feeding device, and correction of the error.

Referring to the graph of FIG. 10, there will be described an example of the cumulative feeding error of the carrier tape 50 by the carrier-tape feeding device 66, wherein the actual angle of rotation of the sprocket wheel 112 is smaller than the nominal value, that is, the actual angle of rotation when the photoelectric sensor 124 is turned on is smaller than the nominal value. The cumulative feeding error (N•θMU−θMN) increases with an increase in the number N of the intermittent feeding actions of the carrier tape 50 (number N of the components 20 which have been transferred to the component-supply position). Therefore, the cumulative feeding error is obtained each time the output signal of the photoelectric sensor 124 is changed from the OFF signal to the ON signal. An absolute value of the obtained cumulative feeding error is compared with a predetermined upper limit. If the absolute value is not larger than the upper limit, it indicates that the carrier tape 50 is normally fed. In this case, no adjustment of the operating angle of the stepping motor 100 is made. If the absolute value is larger than the upper limit, the operating angle of the stepping motor 100 is adjusted so as to zero the feeding error, and the nominal and actual total angles of operations N•θMU and θMN are reset, as indicated in FIG. 10. If the absolute value of the cumulative feeding error (N•θMU−θMN) has exceeded the predetermined upper limit, the angle of operation of the stepping motor 100 is increased by the cumulative feeding error, when the motor 100 is operated for the next feeding action of the carrier tape 50, and the nominal and actual total angles of operations N•θMU and θMN are reset before this operation of the motor 100. This arrangement prevents a continued increase of the cumulative feeding error, and a resulting decrease in the accuracy of positioning of the electronic components at the component-supply position of the feeder 40.

As shown in FIG. 5, the covering-tape removing device 68 includes rotary tape-pulling members in the form of a pair of pinch rollers 134, 136, a driving belt 138 for transmitting a rotary motion of the driving pulley 106 of the carrier-tape feeding device 66 to the pinch roller 134, and a driven pulley 140 which is rotatable with the pinch roller 134 and connected to the driving pulley 106 through the driving belt 138. The covering tape 54 is passed through a nip between the pinch rollers 134, 136 held in elastically pressing contact with each other. When the pinch rollers 134, 136 are rotated with the pinch roller 134 rotated with the driven pulley 140 rotated by the driving pulley 10y, the covering tape 54 is fed and separated or removed from the substrate 48 of the carrier tape 50. Thus, the stepping motor 100 is used as a common drive source for the carrier-tape feeding device 66 and the covering-tape removing device 68, so that the feeding of the carrier tape 50 and the removal of the covering tape 54 take place concurrently with each other. The length portion of the covering tape 54 which has been removed from the substrate 48 is passed through a slit 144 (shown in FIG. 8) formed through the covering member 115, and then through the nip of the pinch rollers 134, 136, and is fed downwards through a guide tube 142 located below the pinch rollers 134, 136. In the present embodiment, timing pulleys are used as the pulleys 106, 110 of the carrier-tape feeding device 66 and the pulley 140 of the covering-tape removing device 68, and timing belts are used as the belts 108, 138 of the feeding and removing devices 66, 68.

Then, the component-mounting device 22 will be described. In the present embodiment, the component-mounting device 22 includes three component-mounting units 150, and an XY robot 152 operable to move or position these component-mounting units 150 in the XY plane, to receive the electronic components 20 and mount them at predetermined component-mounting spots on the component-mounting surface 28 of the printed-wiring board 14.

As shown in FIG. 1, the XY robot 152 includes a Y-axis slide 160 disposed on the machine base 10 movably in the Y-axis direction, a Y-axis-slide positioning device 162 operable to move and position the Y-axis slide 160 in the Y-axis direction, an X-axis slide 164 disposed on the Y-axis slide 160 movably in the X-axis direction, and an X-axis-slide positioning device 166 operable to move and position the X-axis slide 164 in the X-axis direction.

The Y-axis-slide positioning device 162 includes a drive source in the form of a Y-axis drive motor 168, a ballscrew 170 rotatably disposed so as to extend in the Y-axis direction and connected to the drive motor 168, a ballnut 172 fixed to the Y-axis slide 160, a pair of guiding members 174 in the form of rails fixedly disposed so as to extend in the Y-axis direction, and sliding blocks 176 fixed to the Y-axis slide 160 and held in sliding engagement with the guiding members 174. The ballscrew 170 and the ballnut 172 cooperate to constitute a motion converting device operable to convert a rotary motion of the Y-axis drive motor 168 into a linear motion of the Y-axis slide 160. The guide members 174 and the sliding blocks 176 cooperate to constitute a guiding device operable to guide the linear motion of the Y-axis slide 160 in the Y-axis direction. The ballscrew 170 and the guiding members 174 are supported by a plurality of columns 178 provided on the machine base 10 so as to extend in the vertical direction, such that the ballscrew 170 and guiding members 174 are located above the PWB conveyor 14 and the component-supplying devices 24, 26. The component-mounting device 22 is of a so-called suspension type supported by the vertical columns 178.

As shown in FIG. 2, the X-axis-slide positioning device 166 includes a drive source in the form of an X-axis drive motor 180, a ballscrew 182 rotatably disposed on the Y-axis slide 160 so as to extend in the X-axis direction and connected to the drive motor 180, a ballnut 184 (shown in FIG. 3) fixedly disposed on the X-axis slide 180, a guiding member 186 in the form of a rail fixedly disposed so as to extend in the X-axis direction, and a sliding block 188 fixed to the X-axis slide 164. The ballscrew and the ballnut 184 cooperate to constitute a motion converting device operable to convert a rotary motion of the X-axis drive motor 180 into a linear motion of the X-axis slide 164. The guiding member 186 and the sliding block 188 cooperate to constitute a guiding device operable to guide the linear motion of the X-axis slide 164 in the X-axis direction. The X-axis slide 164 is movable to a desired position in the XY plane, with a movement of the X-axis slide 164 by the X-axis-slide positioning device 166 in the X-axis direction, and a movement of the Y-axis slide 160 by the Y-axis-slide positioning device 162 in the Y-axis direction. In the present embodiment, the X-axis slide 164 functions as a movable member which carries nozzle holders 202 which will be described. However, a movable member carrying the nozzle holders 202 may be fixed on the X-axis slide 164 so that the movable member is moved with the X-axis slide 164.

The three component-mounting units 140 are disposed on the X-axis slide 164 such that these units 140 are arranged in a row parallel to the X-axis direction. The three component-mounting-units 150 are identical in construction with each other. As shown in FIG. 3, each component-mounting unit 150 includes a suction nozzle 200, a nozzle holder 202 for holding the suction nozzle 200, and a nozzle-holding moving device in the form of a nozzle-holder elevating and lowering device 204 operable to move the nozzle holder 202 in a vertical or Z-axis direction perpendicular to the XY plane, that is, to elevate and lower the nozzle holder 202 toward and away from the printed-wiring board 14. The component-mounting unit 150 further includes a nozzle-holder rotating device 206 operable to rotate the nozzle holder 202 about its vertically extending axis of rotation.

The nozzle-holder elevating and lowering device 204 includes a movable member in the form of an elevator member 210 disposed on the X-axis slide 164 movably in the vertical direction, and an elevator moving device 212 which includes a drive source in the form of a vertical drive motor 216, a driving pulley 218 connected to the drive motor 216, a driven pulley 220 connected to the driving pulley 218 through a driving belt 222, and a feedscrew in the for of a ballscrew 224 connected to the driven pulley 220. The driving and driven pulleys 218, 220 and the driving belt 222 cooperate to constitute a rotation transmitting device for transmitting a rotary motion of the vertical drive motor 216 into a linear motion of the ballscrew 224. The ballscrew 224 is disposed on the X-axis slide 164 such that the ballscrew 224 is rotatable about its vertically extending axis of rotation and is not axially movable relative to the X-axis slide 224. The elevator moving device 212 further includes a ballnut 226 fixed to the elevator member 210. The ballscrew 224 is held in meshing engagement with the ballnut 226, so that the elevator member 210 is vertically moved when the ballscrew 224 is rotated. The vertical movement of the elevator member 210 is guided by a guiding device including a pair of guiding members 228 (one of which is shown in FIG. 3) in the form of a pair of rails. The driving and driven pulleys 218, 220 are timing pulleys, while the driving belt 222 is a timing belt.

The nozzle holder 202 described above is supported by the elevator member 210 such that the nozzle holder 202 is rotatable about its vertically extending axis of rotation. The suction nozzle 200 is removably held by the nozzle holder 202, and is rotated about the axis of rotation of the nozzle holder 202 when the nozzle holder 202 is rotated. Further, when the elevator member 210 is vertically moved, the nozzle holder 202 is vertically moved, and the suction nozzle 200 is vertically moved with the nozzle holder 202. In the present embodiment, the nozzle holder 202 is constructed as disclosed in Japanese Patent No. 3093339. The nozzle holder 202 and a portion of the elevator member 210 at which the nozzle holder 202 is supported cooperate to constitute a component-mounting head operable to mount the electronic components 20 on the printed-wiring board 14.

The nozzle-holder rotating device 206 described above is disposed on the elevator member 210. The nozzle-holder rotating device 206 includes a drive source in the form of a nozzle-holder rotating motor 240, a driving gear 242 connected to the motor 240, and a driven gear 244 meshing with the driving gear 242 and fixed to the nozzle holder 202. A rotary motion of the motor 240 is transmitted to the nozzle holder 202 through the driving and driven gears 242, 244, so that the nozzle holder 202 is bidirectionally rotatable about its vertical axis of rotation by a desired angle.

Figure 4:
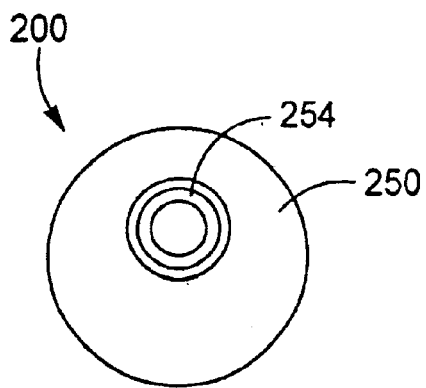
FIG. 4 is a bottom plan view of a suction nozzle of the electronic-component mounting device described above.

The suction nozzle 200 includes a nozzle body 250, and a suction tube 252 partly fitted in the nozzle body 250. The nozzle body 250 functions as a fixing portion of the suction nozzle 200, while the suction tube 252 functions as a sucking portion of the suction nozzle 200. The suction nozzle 200 is held at its fixing portion in the form of the nozzle body 250, by the nozzle holder 202, such that the suction nozzle 200 is axially movable but not rotatable relative to the nozzle holder 202. In the present embodiment, the nozzle body 250 is held by the nozzle holder 202 such that the nozzle body 250 is coaxial or concentric with the nozzle holder 202. On the other hand the suction tube 252 is fixed to the nozzle body 250 such that the suction tube 252 is eccentric with respect to the nozzle body 250, as indicated in FIG. 4, so that a lower sucking end face 254 of the suction tube 252 is offset from the centers of the nozzle body 250 and nozzle holder 202.

When the nozzle holder 202 is rotated, therefore, the sucking end face 254 is turned about the axis of rotation of the nozzle holder 202, so that the positions of the sucking end face 254 in the X-axis and Y-axis directions are changed. Accordingly, a distance between the centers of the sucking end faces 254 of the suction nozzles 200 of the two adjacent ones of the three component-mounting units 150 can be adjusted by rotating the nozzle holder 202 to turn the sucking end face 254 of one of the two adjacent suction nozzles 200. Thus, the position of the sucking end face 254 relative to the component-supply position of the feeder 40 in the X-axis direction can be adjusted for compensation for various positioning errors in the X-axis direction, as described below in detail.

The suction nozzle 200 is arranged to hold the electronic component 20 by suction under a negative pressure. To this end, the suction nozzle 200 is selectively communicated with negative and positive pressure sources (not shown), and the atmosphere, through passages formed through the nozzle holder 202 and the other components, and through an electromagnetically operated directional control valve (not shown), as well known in the art, for holding the electronic component 20 by suction at the component-supply position, and releasing the component 20 when the electronic component 20 is mounted on the printed-wiring board 14.

The driven gear 244 carries a light-emitting disc 260 fixed thereto such that the suction nozzle 200 extends through a center hole formed through the disc 260. The light-emitting disc 260 has a lower annular surface coated with a fluorescent material to provide a light-emitting surface 262.

For easier understanding of the invention, it is assumed in this embodiment that the three suction nozzles 200 have the same size and configuration, and are able to hold the electronic components 20 of different kinds to be supplied by the different feeders 40 of the component-supplying devices 24, 26.

Further, the three component-mounting units 150 are mounted on the X-axis slide 164 such that the nominal spacing pitch of the nozzle holders 202 in the X-axis direction, namely, the nominal distance between the rotation axes of the adjacent nozzle holders 202 is equal to a multiple of the feeder-holding pitch with which the feeders 40 are held by the respective feeder holding devices 78 on the support table 42, in the spaced-apart relation with each other in the X-axis direction.

As shown in FIG. 3, the X-axis slide 164 is also provided with a fiducial-mark imaging system 272 operable to take images of two fiducial marks 270 (shown in FIG. 1) provided on the printed-wiring board 14. The two fiducial marks 270 are located at respective two diagonally opposed corner positions of the rectangle of the printed-wiring board 14, as shown in FIG. 1. The fiducial-mark imaging system 272 includes a fiducial-mark camera 274 (shown in FIG. 3) and an illuminating device (not shown).

In the present embodiment, the fiducial-mark camera 274 is provided with an imaging portion including solid image sensors in the form of a matrix of CCDs (charge-coupled devices), and a lens system including a focusing lens. This fiducial-mark camera 274 provided with the matrix of CCDs is an imaging device capable of taking a two-dimensional image of the object at one time. The matrix of CCDs consists of a multiplicity of minute photosensitive elements which are arranged in a matrix in one plane and which generate electric signals according to the amounts of incident light. The multiple photosensitive elements collectively define an imaging area or screen of the fiducial-mark camera 274, which is disposed with its optical axis extending in the vertical direction, such that the camera 274 faces downwards.

As shown in FIG. 1, two component imaging systems 280 are fixedly disposed at respective positions on of the machine base 10 between the PWB conveyor 16 and the respective two component-supplying devices 24, 26. These two component imaging systems 280 are identical in construction with each other.

Each component imaging system 280 is provided with an imaging device in the form of a component camera 282, and an illuminating device (not shown). Like the fiducial-mark camera 74, the component camera 282 is a CCD camera capable of taking a two-dimensional image of the object at one time. The component camera 282 is disposed with its optical axis extending in the vertical direction, such that the component camera 282 faces upwards. The illuminating device is disposed near the component camera 282, and is arranged to irradiate the object with a selected one of a ultraviolet radiation and a visible radiation, to obtain a projection or silhouette image or a normal image of the object, selectively.

Figure 11:
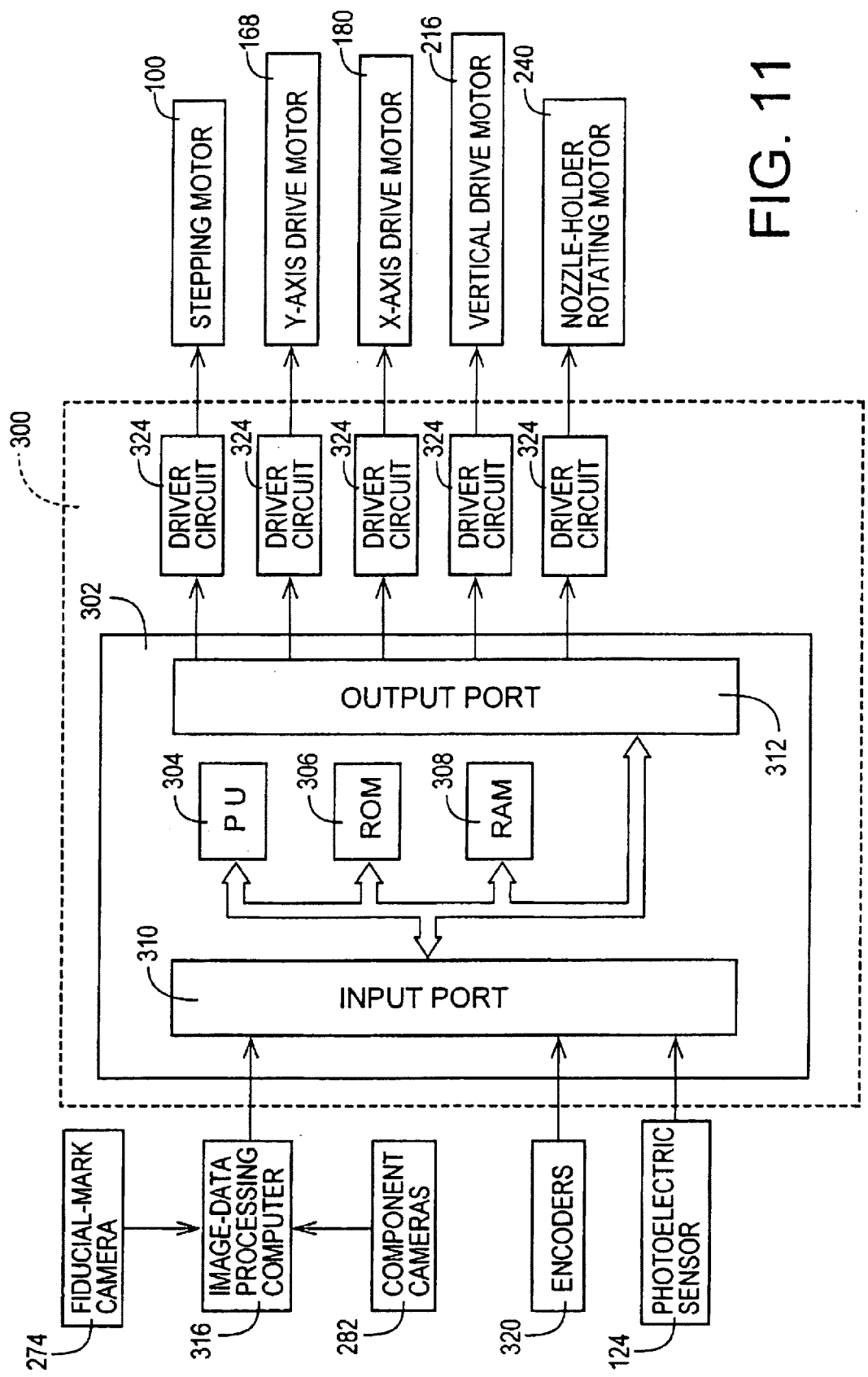
FIG. 11 is a block diagram illustrating of a control device and some other elements of the electronic-component mounting system which relate to the present invention.

The present electronic-component mounting system uses a control device 300 shown in FIG. 11, which also shows the other elements of the system which relate to the present invention. The control device 300 is principally constituted by a computer 302 incorporating a processing unit (PU) 304, a read-only memory (ROM) 306, a random-access memory (RAM) 308, an input port 310 and an output port 312, which are interconnected with each other through a bus line. To the input port 310, there are connected an image-data processing computer 316, the above-described photoelectric sensor 124, encoders 320, and various other detectors and computers. The image-data processing computer 316 is arranged to process image data indicative of the images taken by the fiducial-mark camera 274 and the component camera 280.

To the output port 312, there are connected through respective driver circuits 324 various actuators such as the stepping motor 100, Y-axis drive motor 168, X-axis drive motor 180, vertical drive motor 216 and nozzle-holder rotating motor 240, which have been discussed. In the present embodiment, the motors 168, 180, 216, 240 provided as drive sources are electric rotary motors in the form of servomotors the operating amount or angle of which can be controlled with a comparatively high degree of accuracy. These servomotors may be replaced by stepping motors. The angles of operation of the motors 168, 180, 216, 240 are detected by the encoders 320, the output signals of which are used to control those motors. The RAM 308 stores various programs and data, such as an electronic-component mounting program, and a positioning-error detecting program. According to the electronic-component mounting program, the suction nozzles 200 receive the electronic components 20 from the component-supplying devices 24, 26, and mount the electronic components 20 on the printed-wiring board 14, to thereby fabricate an electronic circuit or a printed-circuit board. The positioning-error detecting program is executed to detect various positioning errors such as the positioning errors of the axes of rotation of the nozzle holders 202.

There will be described an operation of the present electronic-component mounting system. Prior to an operation of the system to mount the electronic components 20 on the printed-wiring board 14, the control device 300 detects the positioning errors of the axes of rotation of the three nozzle holders 202, the eccentricity values of the sucking end faces 254 of the three suction nozzles 200, and the positioning errors of the component-supply portions 122 of all of the tape feeders 40 of the component-supplying devices 24, 26. When the suction nozzles 200 receive the electronic components 20 from the feeders 40, the control device 300 controls the component-mounting units 150 and the feeders 40, so as to eliminate the above-indicated positioning errors of the rotation axes of the nozzle holders 202 and the component-supply portions 122, by utilizing the eccentricity of the sucking end faces 254 and adjusting the component-supply positions at which the electronic components 20 fed by the feeders 40 are stopped in the component-supply portions 122. Thus, the suction nozzles 200 are accurately aligned with the electronic components 20 located at the component-supply positions, so that the electronic components 20 can be simultaneously held by the respective suction nozzles 200, with high positioning accuracy.

The positioning errors of the axes of rotation of the nozzle holders 202 and the eccentricity values of the sucking end faces 254 of the suction nozzles 200 are detected on the basis of images of the sucking end faces 254 taken by one of the component cameras 282. The positioning errors of the component-supply portions 122 of the feeders 40 are detected on the basis of images of gauge tapes 350 set on the feeders 40, which are taken by the fiducial-mark camera 274. To this end, the three nozzle holders 202 and the fiducial-mark camera 274 are moved by the XY robot 152 to predetermined imaging positions according to predetermined positioning data, to take the images of the sucking end faces 254 and the images of the gauge tapes 350. For easier understanding of the detection of the rotation axes of the nozzle holders 202 and the alignment of the sucking end faces 254 with the electronic components 20, the following description is based on an assumption that the fiducial-mark camera 274 and the component cameras 282 have the nominal positional relationships with the X-axis slide 164 (XY robot 152), without relative positioning errors therebetween, and that the XY robot 152 has neither a zero-position error nor feeding errors in the X-axis and Y-axis directions.

The detection of the positioning errors of the axes of rotation of the nozzle holders 202 will be first explained. The axes of rotations of the nozzle holders 202 have positioning errors due to errors caused during the manufacture and assembling. To detect the positioning errors, the three nozzle holders 202 are sequentially moved to a position right above one of the component cameras 282, according to positioning data generated on the basis of the nominal positions of the rotation axis of each nozzle holder 202 and the positions of the center of the imaging area of the component camera 282. According to the positioning data, the axis of rotation of the nozzle holder 202 is located on the center of the imaging area.

When the positioning errors of the rotation axes of the nozzle holders 202 are detected, the suction nozzles 200 are mounted on the respective nozzle holders 202. The normal front images (not silhouette images) of the sucking end face 254 of the suction nozzle 200 mounted on each nozzle holder 202 are taken by the component camera 282 at a plurality of angular positions, for instance, at two angular positions of the nozzle holder 202. The sucking end face 254 is irradiated with a visible light emitted-from the illuminating device of the component imaging system 280, and the images of the sucking end face 254 are taken on the basis of a component of the visible light which has been reflected from the sucking end face 254.

For example, the two angular image-taking positions of the nozzle holder 202 at which the images of the sucking end face 254 are taken consist of a predetermined angular zero position of the nozzle holder 202 corresponding to a zero-point of the nozzle-holder rotating motor 240, and an angular position of the nozzle holder 202 which is spaced by 180° from the angular zero position. To this end, the angular zero position of the encoder 320 for detecting the angular position of the nozzle-holder rotating motor 240 is mechanically detected to detect the angular zero position of the motor 240.

Figure 12A:
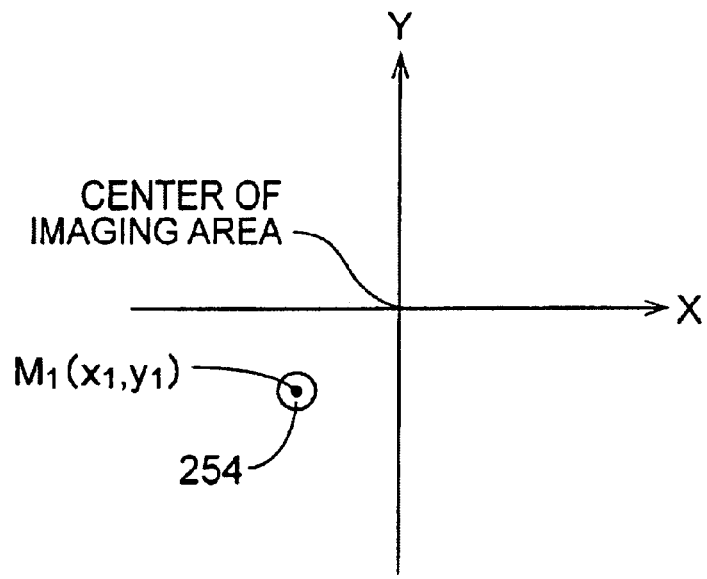
FIGS. 12A and 12B are views for explaining a manner of detecting the axis of rotation of a nozzle holder for holding the suction nozzle described above.
Figure 12B:
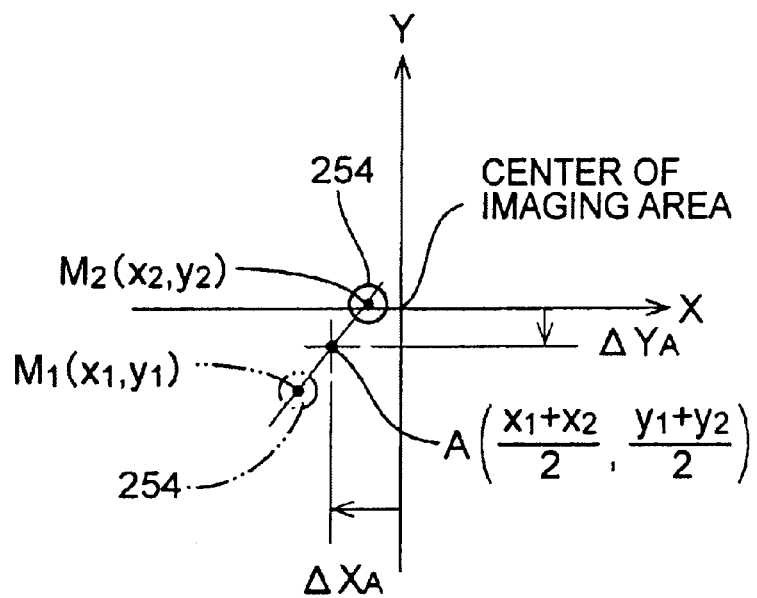

After the image of the sucking end face 254 when the nozzle holder 202 is placed at its angular zero position, the nozzle holder 202 is rotated by 180°, to take the image of the sucking end face 254 at the other angular image-taking position. Image data indicative of the two images of the sucking end face 254 are processed by the image-data processing computer 316. In a specific example of FIGS. 12A and 12B, two images of the sucking end face 254 as indicated in these two figures are obtained in the imaging screen of the component camera 282, at the respective two angular image-taking positions of the nozzle holder 202, which are spaced by 180° from each other in the rotating direction of the nozzle holder 202. The rotation axis A of the nozzle holder 202 is located at a midpoint between centers M1 and M2 of the two images of the sucking end face 254. Where these centers M1, M2 have coordinate values (x1, y1) and (x2, y2), respectively, the rotation axis A have coordinate values {(x1+x2)/2, (y1+y2)/2}. The positioning errors $\Delta XA$ and $\Delta YA$ of the actual rotation axis A of the nozzle holder 202 with respect to its nominal rotation axis are represented by distances between the actual rotation axis A and the center of the imaging area of the component camera 282. The thus obtained positioning errors $\Delta XA$ and $\Delta YA$ of the actual rotation axis A of the nozzle holder 202 are stored in the RAM 308, in relation to identification data of the nozzle holder 202 (data indicative of the position of the nozzle holder 202 on the X-axis slide 164).

Next, the detection of the eccentricity values of the sucking end faces 254 will be described. The suction tube 252 is made eccentric with respect to the nozzle body 250, by a predetermined nominal amount. However, the actual value of eccentricity of the suction tube deviates from the nominal value, due to errors in the manufacture and assembling of the suction nozzle 200 and due to bending of the suction tube. The actual values of eccentricity of the suction tubes 252 are detected on the basis of the images of the sucking end faces 254 taken by the component camera 282.

The nozzle holders 202 are used to hold the suction nozzles 200 of the same or different kinds. While the position of the rotation axis of each nozzle holder 202 is unchanged even when the suction nozzles 200 of different kinds are held by the nozzle holder 202, the position of the sucking end face 254 of the suction nozzle 200 may be changed depending upon the specific kind of the suction nozzle 200 held by the nozzle holder 202. Further, the position of the sucking end face 254 of each suction nozzle 200 may vary each time the suction nozzle 200 is mounted on the nozzle holder 202. In view of this, the value of eccentricity of the sucking end face 254 is detected each time that suction nozzle 200 is mounted on the nozzle holder 202, to hold the electronic component 20.

Figure 13:
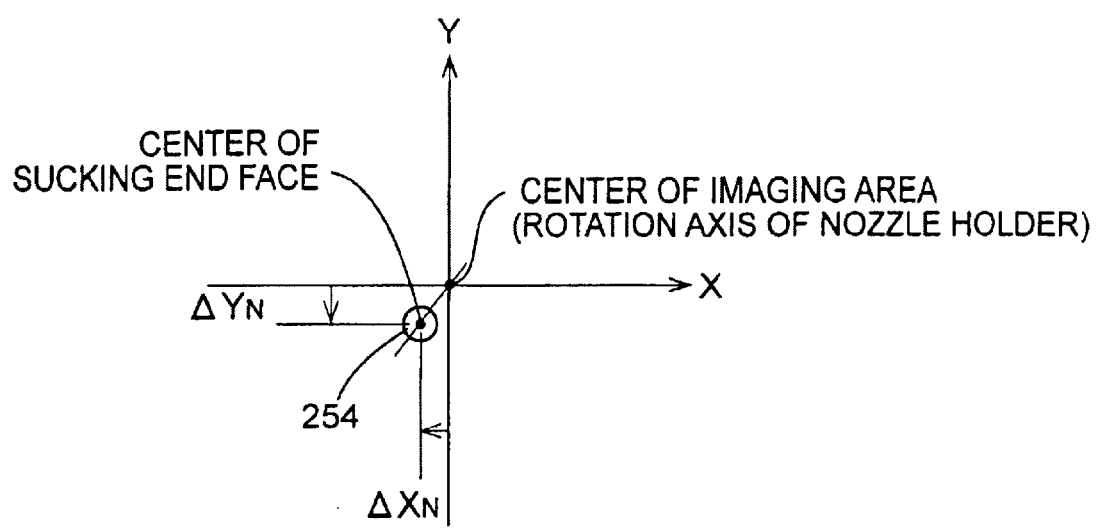
FIG. 13 is a view for explaining a manner of detecting positioning errors of the sucking end face of the suction nozzle.

When the suction nozzle 200 used to mount the electronic component 20 has been held by the nozzle holder 202, the nozzle holder 202 is moved to the position of one of the component cameras 282. At this time, the positioning data to move the nozzle holder 202, which have been prepared on the basis of the nominal positions of the rotation axis of the nozzle holder 202, are adjusted for compensation for the positioning errors of the rotation axis detected in the manner as described above, so that the nozzle holder 202 is moved according to the adjusted positioning data, to the position at which the rotation axis of the nozzle holder 202 is aligned with the center of the imaging area of the component camera 282. Then, the nozzle holder 202 is placed in the angular zero position, and the normal front image of the sucking end face 254 of the suction nozzle 200 held by the nozzle holder 202 is taken by the component camera 282. When the image of the sucking end face 254 is taken, as indicated in FIG. 13, the coordinate values of the center of the taken image with respect to the center of the imaging area are calculated, as the eccentricity values $\Delta XN$ and $\Delta YN$ of the sucking end face 254 with respect to the rotation axis of the nozzle holder 202. The thus obtained eccentricity data $\Delta XN$ and $\Delta YN$ are stored in the RAM 308, in relation to identification data of the suction nozzle 200 in question (which may be the identification data identifying the corresponding nozzle holder 202). The values of eccentricity of the sucking end faces 254 of the three suction nozzles 200 as held by the respective three nozzle holders 202 are detected in the same manner.

Figure 14:
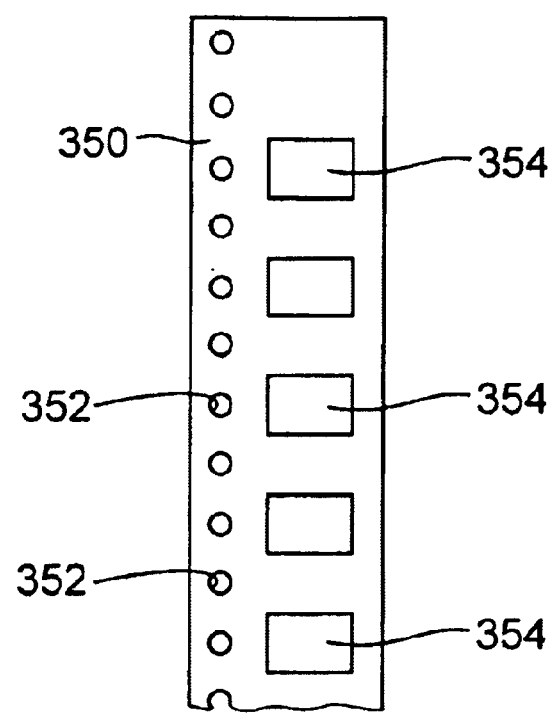
FIG. 14 is a plan view showing a gauge tape used for detecting a positioning error of the component-supply portion of the feeder.

The positioning errors of the component-supply portions 122 of the feeders 40 will then be described. As indicated above, the gauge tape 350 as shown in FIG. 14 are used to detect the positioning errors of the component-supply portions 122, in the present embodiment. The gauge tape 350 has perforations 352 which have the same shape and diameter as the feed holders 56 formed in the substrate 48 of the carrier tape 50. The perforations 352 are formed along one of the opposite sides of the gauge tape 350 such that the perforations 352 are spaced apart from each other in the longitudinal direction of the gauge tape 350, at the same spacing pitch of the feed holes 56. The gauge tape 350 further has fiducial marks 354 having the same shape as the cross sectional shape of the component-accommodating recesses 52 taken in a plane parallel to the surface of the substrate 48, and the same dimensions as the recesses 52. The fiducial marks 354 are equally spaced apart from each other by a spacing pitch equal to a multiple of the spacing pitch of the recesses 52. These perforations 352 and fiducial marks 354 are formed with high accuracy of positioning in the longitudinal and transverse directions of the gauge tape 350, so that the relative positions of the perforations 352 and the fiducial marks 354 are the same as the nominal relative positions of the feed holes 56 and the recesses 52 of the carrier tape 50. The fiducial marks 354 have an optical characteristic, for instance, a color hue, brightness or lightness, which is sufficiently different from that of the other surface area of the gauge tape 350, so that an image of the gauge tape 350 taken by the fiducial-mark camera 274 has a large degree of contrast between the image portion corresponding to the fiducial marks 354 and the image portion corresponding to the other area of the gauge tape 350. Accordingly, clear images of the fiducial marks 354 can be taken, to assure high accuracy of detection of the positions of the fiducial marks 354. For instance, the fiducial marks 354 are black while the other surface area of the gauge tape 350 is white.

The gauges tapes 350 are set on the respective tape feeders 40 of the two component-supplying devices 24, 26, such that the perforations 352 are held in engagement with the teeth 114 of the sprocket wheel 112 of each feeder 40. The gauge tape 350 set on each feeder 40 is fed by rotation of the sprocket wheel 112, to a position at which the photoelectric sensor 124 is turned on. Thus, one of the fiducial marks 354 is aligned with the component-supply portion 122 of the feeder 40. The covering member 115 may be used to cover the gauge tape 350, or may not be used, provided that the elimination of the covering member 115 does not disturb the operation to image the fiducial mark 354. Since the perforations 352 and the fiducial marks 354 of the gauge tape 350 are formed with high accuracy so as to have the same relative position therebetween as the relative position between the feed holes 56 and the recesses 52 of the carrier tape 50, one of the fiducial marks 354 can be located at the component-supply portion 122 of the feeder 40, like the leading one of the recesses 52 in the non-used length of the carrier tape 50. Accordingly, the fiducial mark 354 in question can be accurately positioned relative to the sprocket wheel 112. When the gauge tape 350 is set on the feeder 40, the carrier tape 50 is removed fro the feeder 40, more precisely, at least the leading end portion of the non-used length of the carrier tape 50 is removed from the sprocket wheel 112.

After the gauge tapes 350 have been set on the respective feeders 40, the fiducial-mark camera 274 is moved sequentially to the component-supply portions 122 of the feeders 40, to take the images of the fiducial marks 354 located at the component-supply portions 122. The movements of the fiducial-mark camera 274 are effected according to positioning data which have been prepared so that the center of the imaging area of the fiducial-mark camera 274 is aligned with the nominal component-supply position of each feeder 40. Image data indicative of the images of the fiducial marks 354 are processed by the image-data processing computer 316, to detect the positions of the centers of the images of the fiducial marks 354 with respect to the center of the imaging area of the fiducial-mark camera 274. Thus, the positions of the fiducial marks 354 are detected. The positions of the centers of the fiducial marks 354 represent the actual component-supply positions of the feeders 40. The position of the fiducial mark 354 in the X-axis direction is the position of the component-supply portion 122 of the corresponding feeder 40 in the direction perpendicular to its feeding direction, while the position of the fiducial mark 354 in the Y-axis direction is the position of the leading electronic component 20 in the feeding direction of the feeder 40. If the actual positions of the component-supply portion 122 in the X-axis and Y-axis directions deviate from the center of the imaging area of the fiducial-mark camera 274, the positions of the center of the fiducial mark 354 in the X-axis and Y-axis direction deviate from the center of the imaging area. These deviations of the fiducial mark 354 represent positioning errors $\Delta XF$ and $\Delta YF$ of the actual component-supply position with respect to the nominal component-supply position. The thus obtained positioning errors $\Delta XF$ and $\Delta YF$ of the component-supply portions 122 of the feeders 40 are stored in the RAM 308, in relation to identification data of the feeders 40 (which may be the data indicative of the positions on the support block 42 at which the feeders 40 are held by the feeder holding devices 78). The positioning errors $\Delta XF$ and $\Delta YF$ obtained on the basis of the images of the fiducial marks 354 include the feeding errors of the carrier-tape feeding devices 66, and manufacturing and positioning errors of the feeders 40 (including errors due to flexure of the feeder bodies 62), and but do not include errors associated with the gauge tapes 350, since the gauge tapes 350 are formed with high dimensional accuracy (high accuracy of relative positioning between the perforations 352 and the fiducial marks 354, as described above).

The operation to mount the electronic components 20 on the printed-wiring board 14 is initiated after the detection of the positioning errors of the rotation axes of the nozzle holders 202 and the component-supply portions 122 of the tape feeders 40 and the detection of the eccentricity values of the sucking end faces 254 of the suction nozzles 200. Each time the printed-wiring board 14 is loaded onto the PWB holding device 18 and held by this PWB holding device 18, the images of the fiducial marks 270 are taken by the fiducial-mark camera 274, to detect the positioning errors of the board 14 as held by the PWB holding device 18. The positioning errors $\Delta XF$ and $\Delta XY$ of the component-mounting spots on the component-mounting surface 28 on the board 14 are calculated on the basis of the image data indicative of the images of the fiducial marks 270.

In a component-mounting operation of the present electronic-component mounting system, at least one of the three suction nozzles 200 is operated at one time to receive the electronic component or components 20 from the component-supplying device 24 or 26. When the two or three suction nozzles 200 are used to receive the electronic components 20, these suction nozzles 200 are simultaneously operated. There will be described a component-mounting operation wherein all of the three suction nozzles 220 are simultaneously operated to receive the respective electronic components 20 from the respective tape feeders 40.

Figure 15:
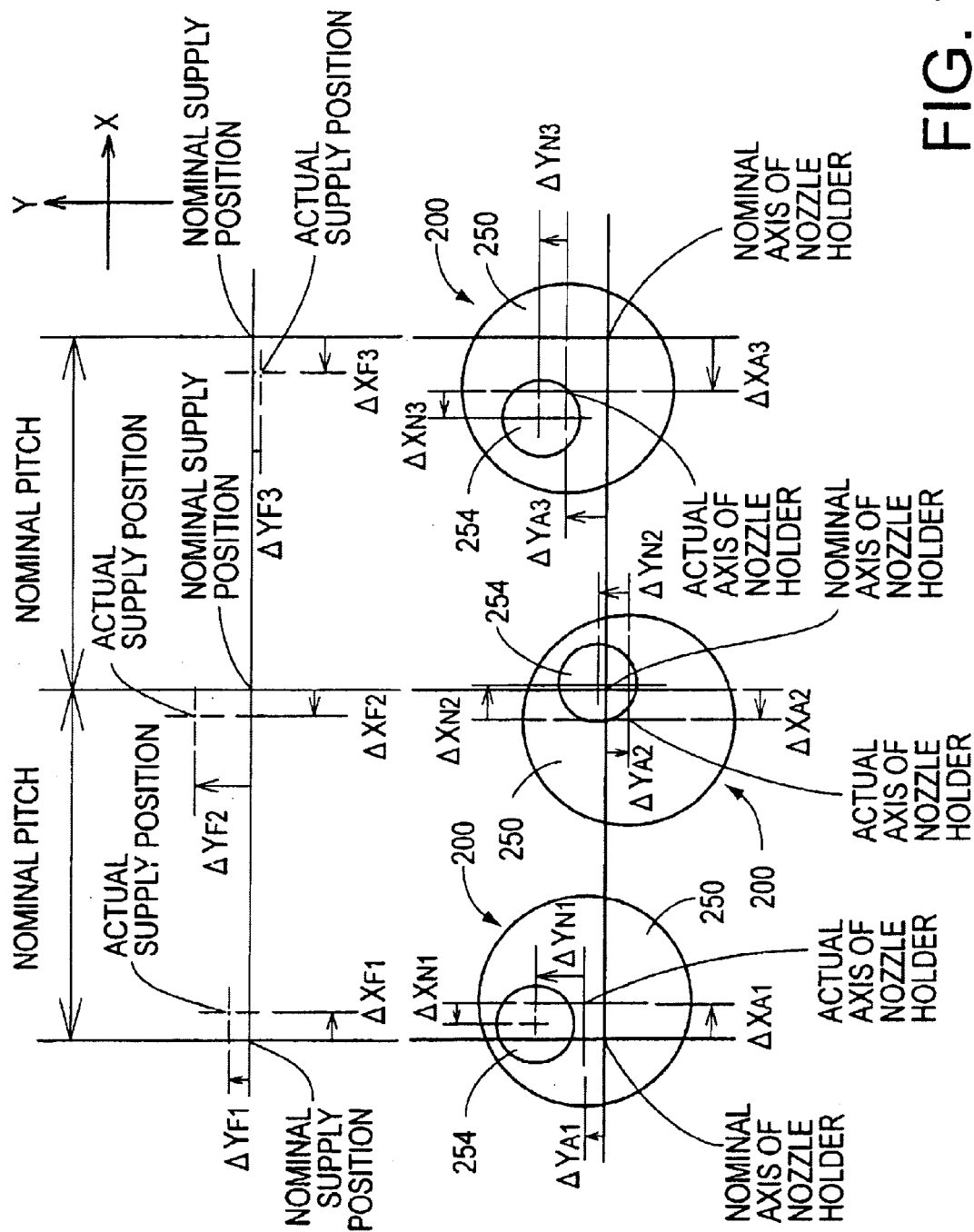
FIG. 15 is a view indicating the positioning errors of the component-supply portions of the feeders, positioning errors of the rotation axis of the nozzle holder, and positioning errors of the sucking end face of the suction nozzle.

The three nozzle holders 202 are disposed on the X-axis slide 164 such that the axes of rotation of the nozzle holders 202 are spaced from each other in the X-axis direction with the spacing pitch which is equal to a multiple of the nominal spacing pitch of the tape feeders 40 arranged on the support block 42 in the X-axis direction. The three nozzle holders 202 receive the electronic components 20 from the respective three tape feeders 40 which are spaced from each other with the same spacing pitch as that of the rotation axes of the three nozzle holders 202 and which are used to feed the carrier tapes 50 accommodating the electronic components 20 to be mounted next on the printed-wiring board 12. There will be described an operation of the control device 300 to align the sucking end faces 254 of the suction nozzles 200 with the positions of the electronic components 20 supplied from the above-indicated three tape feeders 40, in a specific example of FIG. 15 in which the component-supply portions 122 of the selected three feeders 40 corresponding to the three suction nozzles 200 have respective positioning errors $\Delta XF1$, $\Delta XF2$ and $\Delta XF3$ in the X-axis direction, and respective positioning errors $\Delta YF1$, $\Delta YF2$ and $\Delta YF3$ in the Y-axis direction, and the axes of rotation of the corresponding three nozzle holders 202 have respective positioning errors $\Delta XA1$, $\Delta XA2$ and $\Delta XA3$ in the X-axis direction, and respective positioning errors $\Delta YA1$, $\Delta YA2$ and $\Delta YA3$ in the Y-axis direction, while the sucking end faces 254 of the corresponding three suction nozzles 200 have respective eccentricity values $\Delta XN1$, $\Delta XN2$ and $\Delta XN3$ in the X-axis direction, and respective eccentricity values $\Delta YN1$, $\Delta YN2$ and $\Delta YN3$ in the Y-axis direction. Although the sucking end faces 254 are imaged by the component-camera 282 in the upward direction, FIGS. 15 and 16 show the eccentricity values of the sucking end faces 254 and the positioning errors of the rotation axes of the nozzle holders 202, as if these eccentricity values and positioning errors were obtained from the images of the sucking end faces 254 taken in the downward direction. Positive and negative signs used in FIG. 15 for the eccentricity values and positioning errors follow those of the XY coordinate system set for the present electronic-component mounting system. In FIGS. 15 and 16, the upward direction corresponds to the positive Y-axis direction, while the rightward direction corresponds to the positive X-axis direction. The amounts of the eccentricity of the sucking end faces 254 and the amounts of the positioning errors of the nozzle holders 202 and suction nozzles 200 are exaggeratedly shown in FIGS. 15 and 16, for the sake of explanation.

The three component-mounting units 150 are mounted on the common X-axis slide 164, and are moved together by the XY robot 152 in the X-axis and Y-axis directions. Accordingly, a set of positioning data prepared for one of the three nozzle holders 202 are used to move the X-axis slide 164 in the XY plane, for moving the three component-mounting units 150, for the corresponding three suction nozzles 200 to receive the electronic components 20. For example, a set of position data prepared for the nozzle holder 202 of the intermediate one of the three component-mounting units 150 are used to move the component-mounting units 150. This set of positioning data is prepared so that the nominal axis of rotation of this nozzle holder 202 is moved into alignment with the nominal component-supply position of the tape feeder 40 from which the electronic component 20 is supplied to the suction nozzle 200 held by the nozzle holder 202 of the intermediate component-mounting unit 150 in question.

Figure 16A:
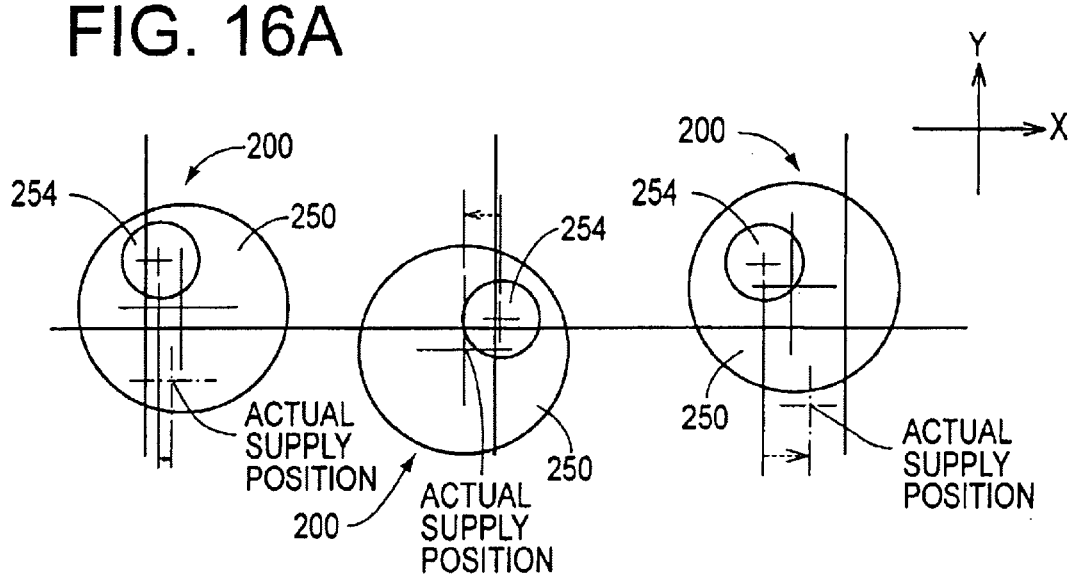
FIGS. 16A, 16B, and 16C are views for explaining a manner of eliminating positioning errors of an electric component as held by suction by the suction nozzle.

Before the X-axis slide 164 is moved according to the set of positioning data for the intermediate nozzle holder 202, this set of positioning data are adjusted on the basis of the positioning errors $\Delta XA2$ and $\Delta YA2$ of the axis of rotation of this intermediate nozzle holder 202, and the positioning errors $\Delta XF2$ and $\Delta YF2$ of the component-supply portion 122 of the corresponding feeder 40. Then, the X-axis slide 164 is moved according to the thus adjusted positioning data, so that the actual axis of rotation of the intermediate nozzle holder 202 is aligned with the actual component-supply position of the component-supply portion 122 of the corresponding tape feeder 40, as indicated in FIG. 16A.

In this state, the sucking end faces 254 of the three suction nozzles 200 are offset from the actual component-supply positions of the corresponding three feeders 40. If the electronic components 20 are fed and located at the actual component-supply positions, the sucking end faces 254 are not aligned with the electronic components 20. However, the positioning errors of the sucking end faces 254 with respect to the electronic components 20 in the X-axis direction can be eliminated by rotating the suction nozzles 200 so as to adjust the distances between the centers of the sucking end faces 254 of the suction nozzles 200 held by the adjacent nozzle holders 202, that is, to adjust the distances between the rotation axes of the adjacent suction nozzles 200. Further, the positioning errors of the sucking end faces 254 with respect to the electronic components 20 in the Y-axis direction can be eliminated by adjusting the positions at which the electronic components 20 are fed and located by the carrier-tape feeding devices 66. Accordingly, the sucking end faces 254 of the three suction nozzles 200 can be accurately aligned with the electronic components 20 located at the component-supply positions of the respective tape feeders 40. Since the sucking end faces 254 are eccentric with respect to the rotation axes of the nozzle holders 202, rotary motions of the nozzle holders 202 to rotate the suction nozzles 200 will cause the sucking end faces 254 to be turned about the rotation axes of the nozzle holders 202, whereby the positions of the sucking end face 254 of each suction nozzle 200 are changed in both the X-axis direction and the Y-axis direction. However, the positions of the electronic components 20 are adjusted in the Y-axis direction only, since the carrier tape 50 is fed in the Y-axis direction only.

Figure 16B:
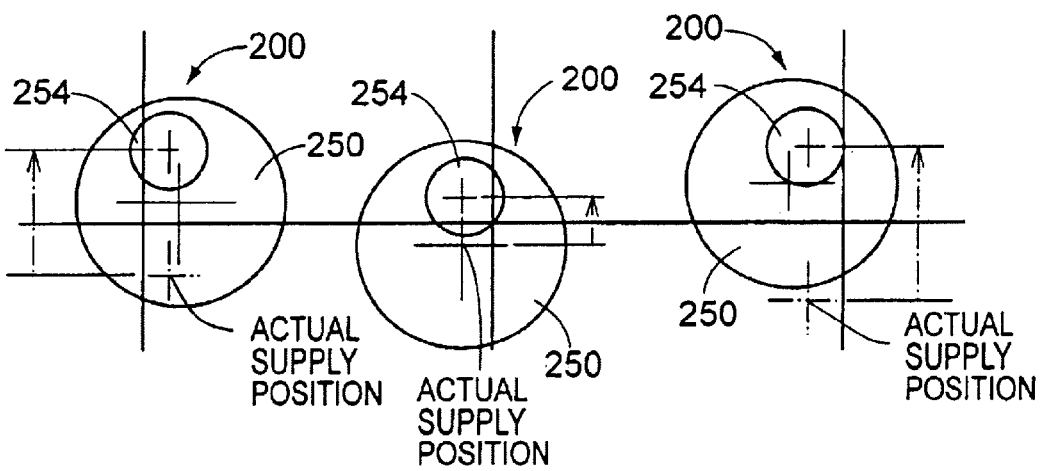

The angle and direction of rotation of each nozzle holder 202 to align the sucking end face 254 with the electronic component 20 in the X-axis direction are determined in the XY coordinate system, with respect to the angular zero position of each nozzle holder 202, on the basis of the position of the center of each sucking end face 254 with respect to the rotation axis of the corresponding nozzle holder 202 placed in its angular zero position, that is, on the basis of the state of eccentricity of each sucking end face 254, and on the basis of the position of the center of each sucking end face 254 with respect to the actual component-supply position of the corresponding feeder 40 in the X-axis direction. The XY coordinate system has its zero point at the axis of rotation of the nozzle holder 202. The angles and directions of rotation of the three nozzle holders 202 are determined as indicated by arrow-headed broken lines in FIG. 16A, and the nozzle holders 202 are rotated from the angular zero position by the determined angles in the determined directions, so that the sucking end faces 254 are moved to the positions at which the centers of the sucking end faces 254 are aligned with the actual component-supply positions in the X-axis direction, as indicated in FIG. 16B.

For the reason which will be understood, two angular positions of each nozzle holder 202 are available to adjust the distances between the rotation axes of the adjacent nozzle nozzles 200, to align the centers of the sucking end faces 254 with the actual component-supply positions of the tape feeders 40. Initially, the control device 300 obtains the X-axis coordinate value of the actual component-supply position of the feeder 40 in the XY coordinate system for each of the three nozzle holders 202, on the basis of the X-axis coordinate value of the center of the sucking end face 254 with respect to the zero point or the axis of rotation or the corresponding nozzle holder 202, and the X-axis position of the center of the sucking end face 254 with respect to the actual component-supply position while the axis of rotation of the intermediate nozzle holder 202 is aligned with the corresponding actual component-supply position. Then, the control device 300 calculates two points of intersection between (a) a straight line which is parallel to the Y-axis direction and which passes the actual component-supply position of the feeder 40 whose X-axis coordinate value has been obtained, and (b) a circular path of movement of the center of the sucking end face 254 about the axis of rotation of the corresponding nozzle holder 202. This circular path has a radius equal to a distance between the center of the sucking end face 254 and the axis of rotation of the corresponding nozzle holder 202. Successively, the control device 300 calculates angles of clockwise and counterclockwise rotations of each nozzle holder 202 about its axis of rotation, from the angular zero position to the respective two points of intersection obtained between the above-indicated straight line and circular path. A smaller one of the calculated angles of the clockwise and counterclockwise rotations, and the corresponding clockwise or counterclockwise direction are selected as the angle and direction of rotation of each nozzle holder 202 to adjust the distances between the axes of rotation of the adjacent suction nozzles 200 in the X-axis direction, for aligning the centers of the sucking end faces 254 with the actual component-supply positions of the corresponding feeders 40 in the X-axis direction.

The X-axis position of the center of the sucking end face 254 of the suction nozzle 200 of the intermediate component-mounting unit 150 with respect to the actual component-supply position of the corresponding feeder 40 in the X-axis direction is represented by the X-axis position ΔXN2 of the center of the sucking end face 254 with respect to the axis of rotation of the nozzle holder 202.

The X-axis position of the center of the sucking end face 254 of the suction nozzle 200 of the left component-mounting unit 150 as viewed in FIG. 16A can be obtained on the basis of not only the values ΔXA1, ΔXN1 and ΔXF1 corresponding to the left component-mounting unit 150, but also the values ΔXA2 and ΔXF2 used to align the axis of rotation of the nozzle holder 202 of the intermediate component-mounting unit 150 with the actual component-supply position of the corresponding feeder 40. The X-axis position of the center of the sucking end face 254 of the suction nozzle 200 of the right component-mounting unit 150 can be obtained in a manner similar to that for the left component-mounting unit 150.

After the electronic components 20 have been transferred from the three suction nozzles 200 onto the printed-wiring board 14, the corresponding nozzle holders 202 are rotated back to their angular zero positions. When these suction nozzles 200 receive the next electronic components 20, the corresponding nozzle holders 202 are rotated by the respective nozzle-holder rotating devices 206, according to the angles and directions determined to align the sucking end faces 254 with the electronic components 20 in the X-axis direction, after the X-axis slide 164 has been moved until the axis of rotation of the intermediate nozzle holder 202 is aligned with the corresponding actual component-supply position. As a result, the sucking end faces 254 of the three suction nozzles 200 are turned about the respective axes of rotation of the corresponding nozzle holders 202, so that the distances between the centers of the sucking end faces 254 of the adjacent suction nozzles 200 are adjusted in the X-axis direction by movements of those centers in the X-axis direction as indicated by the arrow-headed broken lines in FIG. 16A, whereby the centers of the sucking end faces 254 are aligned with the actual component-supply positions of the corresponding feeders 40, in the X-axis direction (perpendicular to the direction of feeding of the electronic components 20), as indicated in FIG. 16B. Namely, the rotary motions of the nozzle holders 202 permit elimination of the positioning errors of the suction nozzles 200 relative to the feeders 40 in the X-axis direction, so as to establish accurate alignment of the sucking end faces 254 with the positions of the component-supply portions 122, that is, with the positions of the electronic components 20 in the X-axis direction.

The value of eccentricity of the sucking end surface 254 with respect to the nozzle holder 202, which is a radial distance between the center of the sucking end face 254 and the rotation axis of the nozzle holder 202, is determined on the basis of expected maximum amounts of positioning errors of the rotation axis of the nozzle holder 202 and the corresponding feeder 40 in the X-axis direction. Namely, the eccentricity value as represented by the above-indicated radial distance is determined to be not smaller than a sum of an absolute value of the expected maximum X-axis positioning error of the rotation axis of the nozzle holder 202 and an absolute value of the expected maximum X-axis positioning error of the component-supply position of the corresponding feeder 40.

Figure 16C:
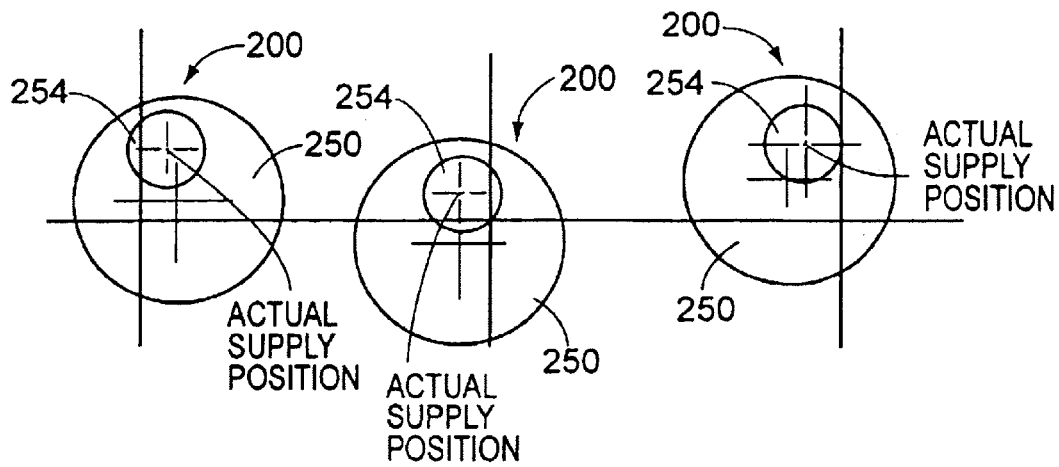

As indicated in FIG. 16B, the center of the sucking end face 254 of each suction nozzle 200 is not usually aligned with the actual component-supply position of the corresponding feeder 40 in the Y-axis direction, as indicated in FIG. 16B, after the nozzle holder 202 has been rotated to align the center of the sucking end face 254 with the actual component-supply position in the X-axis direction as described above. This positioning error is eliminated by controlling the drive signal to be applied to the stepping motor 100, to adjust the position at which the feeding of the carrier tape 50 in the Y-axis direction is stopped, that is, to adjust the actual component-supply position in the Y-axis direction, so that the center of the sucking end face 254 is aligned with the actual component-supply position in the Y-axis direction, as indicated in FIG. 16C. This adjustment of the actual component-supply position is effected on the basis of a distance between the center of the sucking end face 254 and the actual component-supply position in the Y-axis direction, as indicated by arrow-headed one-dot chain lines in FIG. 16B, after the adjustment of the X-axis position of the center of the sucking end face 254 into alignment with the actual component-supply position.

The Y-axis position of the center of the sucking end face 254 of the intermediate suction nozzle 200 with respect to the actual component-supply position of the corresponding feeder 40 can be obtained on the basis of not only the X-axis position ΔYN2 of the center of the sucking end face 254 with respect to the rotation axis of the corresponding nozzle holder 202, and a distance of movement of the center of the sucking end face 254 in the Y-axis direction as a result of the rotation of the corresponding nozzle holder 202 to align the sucking end face 254 with the actual component-supply position in the X-axis direction. On the thus obtained Y-axis position of the center of the sucking end face 254, the drive signal to be applied to the stepping motor 100 is controlled so as to increase or reduce the angle of operation of the stepping motor 100, so that the length of intermittent feeding of the carrier tape 50 is controlled to adjust the actual component-supply position, for aligning the actual component-supply position with the center of the sucking end face 254 of the suction nozzle 200 in the Y-axis direction, as indicated in FIG. 16C.

The Y-axis position of the center of the sucking end face 254 of the left suction nozzle 200 as viewed in FIG. 16A, with respect to the actual component-supply position of the corresponding feeder 40, can be obtained on the basis of not only the values $\Delta YA1$, $\Delta YN1$ and $\Delta YF1$ corresponding to the left suction nozzle 200, but also the values $\Delta YA2$ and $\Delta YF2$ used to align the axis of rotation of the intermediate nozzle holder 202 with the actual component-supply position of the corresponding feeder 40, and a distance of movement of the center of the sucking end face 254 in the Y-axis direction as a result of the rotation of the corresponding nozzle holder 202 to align the sucking end face 254 with the actual component-supply position in the X-axis direction. The Y-axis position of the center of the sucking end face 254 of the right suction nozzle 200 can be obtained in a manner similar to that for the right suction nozzle 200. On the thus obtained Y-axis position of the center of the sucking end face 254, the drive signal to be applied to the stepping motor 100 is controlled to adjust the actual component-supply position, for aligning the actual component-supply position with the center of the sucking end face 254 of the suction nozzle 200 in the Y-axis direction, as indicated in FIG. 16C.

As described above, the alignment of the sucking end face 254 with the actual component-supply position in the X-axis direction is established by rotating the nozzle holder 202 in one of the clockwise and counterclockwise directions which requires a smaller angle of rotation of the nozzle holder 202. Accordingly, the movement of the center of the sucking end face 254 to establish its alignment with the actual component-supply position in the X-axis direction does not cause the sucking end face 254 to be offset or dislocated from the opening 117 of the component-supply portion 122 of the feeder 40. Therefore, the actual component-supply position at which the electronic component 20 is stopped can be aligned with the center of the sucking end face 254 in the Y-axis direction, by controlling the operating angle of the stepping motor 100. However, the rotation of the nozzle holder 202 in one of the clockwise and counterclockwise direction which results in a smaller Y-axis distance between the center of the sucking end face 254 and the actual component-supply position in the condition of FIG. 16B may be more desirable than that in the direction which requires a smaller angle of rotation of the nozzle holder 202, depending upon the arrangement of the feeder 40 including the opening 117.

The eccentricity value of the sucking end face 254 as detected on the basis of its image taken by the component camera 282 includes a positioning error of the sucking end face 254 due to a manufacturing error of the component-mounting unit 150, this positioning error may also be eliminated by the adjustments of the center of the sucking end face 254 and the actual component-supply position so as to establish the alignment therebetween.

After the sucking end faces 254 of the three suction nozzles 20 have been aligned with the actual component-supply positions of the corresponding three feeders 40, the suction nozzles 20 are simultaneously lowered by the respective nozzle-holder elevating and lowering devices 204, to concurrently hold the respective electronic components 20 by suction under a negative pressure. The electronic components 20 can be simultaneously held by the respective three suction nozzles 200 without a holding or sucking failure, owing to the adjustment of distances between the centers of the adjacent sucking end faces 254 in the X-axis direction and the adjustment of the actual component-supply positions of the feeders 40 in the Y-axis direction.

The position of the component-supply portion 122 of the feeder 40 in the Y-axis direction may be adjusted into alignment with the sucking end face 254, by adjusting the actual component-supply position, in a manner similar to that used for correcting a misalignment of the center of the sucking end face 254 with respect to the actual component-supply position due to the feeding error of the carrier-tape feeding device 66, as described above.

The positioning errors of each nozzle holder 202, the eccentricity value of the sucking end face 254 of each suction nozzle 200, and the error of the actual component-supply position of each feeder 40 are stored in the RAM 308, in relation to the identification data indicative of the nozzle holders 202, suction nozzles 200 and feeders 40. On the basis of the specific combinations of the suction nozzles 200 and the feeders 40 assigned to supply these suction nozzles 200 with the electronic components 20, the appropriate sets of data including the positioning errors of the rotation axes of the nozzle holders 202, the eccentricity values of the sucking end faces 254 and the error of the actual component-supply positions of the feeders 40 are read out from the RAM 308, to make the adjustment of the distance of movement of the X-axis slide 164 in the Y-axis direction to align the rotation axis of the intermediate nozzle holder 202 with the actual component-supply position of the corresponding feeder 40, the adjustment of the distances between the centers of the sucking end faces 254 of the adjacent suction nozzles 200 in the X-axis direction, and the adjustment of the actual component-supply positions of the feeders 40 in the Y-axis direction into alignment with the centers of the sucking end faces 254. In principle, the electronic components 20 are received by the suction nozzles 200, in the predetermined order in which the electronic components 20 are mounted on the printed-wiring board 14. If some electronic components 20 are not mounted on the board 14 due to failure of the corresponding suction nozzles 200 to hold the electronic components 20 some reason or other, the order in which the suction nozzles 200 receive the electronic components 20 may be different from the predetermined order of mounting of the electronic components 20 on the board 14. Once the combination of each feeder 40 and the corresponding suction nozzle 200 is determined, the appropriate sets of data including the error of the actual component-supply position of the feeder 40, the eccentricity value of the corresponding sucking end face 254, and the positioning errors of the rotation axis of the corresponding nozzle holder 202 are read out from the RAM 308, to adjust the Y-axis distance of movement of the X-axis slide 164, to rotate the suction nozzle 2000 for turning its sucking end face 254 about the rotation axis for adjusting the X-axis position of the sucking end face 254, and to adjust the operating angle of the stepping motor 100 for aligning the actual component-supply position of the feeder 40 with the center of the sucking end face 254 in the Y-axis direction. The above-indicated adjustments on the basis of the data sets in the RAM 308 permit the three suction nozzles 200 to simultaneously hold the electronic components 20 with improved stability.

After the electronic components 20 have been held by the respective suction nozzles 200, these suction nozzles 200 are elevated to pick up the electronic components 20 from the respective feeders 40. If the component-mounting angular position in which the electronic component 20 is different from the component-holding angular position in which the electronic component 20 is held by the suction nozzle 200, the corresponding nozzle holder 202 is rotated to rotate the electronic component 20 to the component-mounting angular position. Then, the X-axis slide 164 is moved to sequentially move the three electronic components 20 into alignment with the component camera 282.

Described more specifically, each of the three nozzle holders 202 is positioned so as to eliminate the positioning errors of its rotation axis, such that the rotation axis is aligned with the center of the imaging area of the component camera 282. In this condition, an image of the electronic component 20 held by the corresponding suction nozzle 200 is taken by the component camera 282. Positioning data for moving the three nozzle holders 202 into alignment with the component camera 282 to image the respective components 20 are prepared on the basis of the nominal positions of the rotation axes of the nozzle holders 202. The positioning data are adjusted for compensation for the positioning errors of the rotation axes of the nozzle holders 202, when the nozzle holders 202 are moved into alignment with the component camera 282, so that the rotation axis of each nozzle holder 202 lies on the center of the imaging area of the component camera 282. The three nozzle holders 202 are sequentially moved into alignment with the component camera 282, to sequentially obtain the images of the corresponding three electronic components 20.

Image data indicative of the images of the electronic components 20 are compared with stored image data indicative of nominal component-hold positions of the electronic components 20, namely, image data indicative of the positions of the electronic components 20 without component-hold position errors. Thus, actual component-hold position errors of the electronic components 20 as held by the respective suction nozzles 200 are calculated. The actual component-hold position errors of each electronic component 20 consist of horizontal positioning errors, namely, center-position errors $\Delta XE$ and $\Delta YE$ of the center of the electronic component 20 with respect to the axis of rotation of the nozzle holder 202, and an angular positioning error $\Delta\theta$ about the rotation axis of the suction nozzle 200 in a plane parallel to the sucking end face 254.

After the imaging of the electronic components 20, the component-mounting units 150 are moved to respective positions at which the three electronic components 20 are located right above the predetermined component-mounting spots on the printed-wiring board 14. The movements of the three component-mounting units 150 to move the electronic components 20 at the respective component-mounting spots are effected sequentially to mount the three electronic components 20 on the printed-wiring board 14 one after another. Positioning data for moving the three component-mounting units 150 are prepared with respect to the nominal positions of the rotation axes of the respective nozzle holders 202. When the component-mounting units 150 are moved for mounting the electronic components 20 on the board 14, the positioning data for each unit 150 are adjusted for compensation for the positioning errors $\Delta XA$ and $\Delta YA$ of the rotation axis of the nozzle holder 202, the center-position errors $\Delta XE$ and $\Delta YE$ of the electronic component 20, the positioning errors $\Delta XP$ and $\Delta YP$ of the corresponding component-mounting spot on the board 14, and center-position errors of the electronic component 20 which have been caused as a result of rotation of the nozzle holder 202 to eliminate the angular positioning error $\Delta\theta$ of the component 20. During the movement of each component-mounting unit 150 according to the thus adjusted positioning data, the suction nozzle 202 is rotated to eliminate the angular positioning error $\Delta\theta$ of the electronic component 20, for permitting the component 20 to be mounted at the predetermined nominal component-mounting spot, in the predetermined component-mounting angular position.

After the three electronic components 20 have been transferred from the respective suction nozzles 200 onto the printed-wiring board 14, the suction nozzles 200 are moved toward the component-supplying device 24 or 26, for receiving the electronic components 20 to be mounted next. At the same time, the nozzle holders 202 are rotated to their angular zero positions. Before the suction nozzles 200 receive these new electronic components 20, the above-described adjustments are effected to align the centers of the sucking end faces 254 with the actual component-supply positions, that is, with the electronic components 20, so that the electronic components 20 are simultaneously held by the respective suction nozzles 200 with high component-holding accuracy.

It will be understood from the foregoing description of the present embodiment that the X-axis slide 164 functions as a movable member which carries the nozzle holders 202, while a portion of the control device 300 assigned to control the stepping motor 100 constitutes an electric-motor control device operable to control the angle of operation of the stepping motor 100, and also a component-supply-position adjusting device operable to adjust the actual component-supply position of the feeder 40 at which each electronic component 20 is stopped and supplied from the carrier tape 50. It will also be understood that the three nozzle-holder rotating devices 206 operable to rotate the respective three nozzle holders 202 independently of each other constitutes a spacing-distance adjusting device operable to adjust distances between the centers of the sucking end faces 254 of the adjacent ones of the three suction nozzles 200 in the X-axis direction.

It will further be understood that the fiducial-mark camera 274 functions as a component-supply-portion recognizing device operable to recognize the component-supply portion 122 of each feeder 40, and that the image-data processing computer 316 constitutes a component-supply-position obtaining device operable to obtain the position of the component-supply portion 122 of each feeder in the direction of feeding of the electronic components 20, and the component-supply position at which each electronic component 20 is stopped. The component-supply-position obtaining device is operable on the basis of the image data indicative of the images of the gauge tapes 350 taken by the fiducial-mark camera 274. It will also be understood that the component cameras 282 function as a sucking-portion recognizing device operable to recognize the sucking portion of the suction nozzle 200, and that the image-data processing computer 316 constitutes a sucking-position obtaining device operable to obtain the value of eccentricity of the sucking end face 254 on the basis of the image data indicative of the image of the sucking end face 254 taken by the component cameras 282.

It will further be understood that a portion of the control device 300 assigned to control the stepping motors 100 and the nozzle-holder rotating motors 240 on the basis of the positions obtained by the component-supply-position obtaining device and the sucking-position obtaining device and to control the suction nozzles 200 constitutes a component-holding control device operable to adjust the relative positions in the X-axis and Y-axis directions of the sucking end faces 254 of the suction nozzles 200 and the electronic components 20 supplied from the feeders 40, for aligning the sucking end faces 254 and the corresponding electronic components 20 with each other and to activate the suction nozzles 200 to simultaneously hold the electronic components 20, while the sucking end faces 254 and the corresponding electronic components 20 are aligned with each other.

In the embodiment described above, the suction tube 252 (sucking end face 254) of each of the three suction nozzles 200 is eccentric with respect to the nozzle body 250, so that the distances between the axes of the adjacent suction nozzles 200 can be adjusted to establish alignment between the electronic component 20 and the suction nozzle 200 in the X-axis direction perpendicular to the component feeding direction, by rotating the suction nozzle 200 to turn the sucking end face 254 about the axis of the nozzle holder 202. However, the relative position between the suction nozzles 200 and the electronic components 20 in the X-axis direction can be adjusted by moving the axes of rotation of the nozzle holders 202 so as to adjust the distances between the axes of the suction nozzles 200 in the X-axis direction, as in a second embodiment of this invention illustrated in FIGS. 17–19. The same reference signs as used in the first embodiment will be used to identify the corresponding elements of the second embodiment, which will not be described.

In the electronic-component mounting system according to the second embodiment, three component-mounting units 400 are supported by the X-axis slide 164 of the XY robot 152 such that the component-mounting units 400 are arranged in the X-axis direction. An intermediate one of the three component-mounting units 400 is fixed in position on the X-axis slide 174, and the right and left component-mounting units 400 are movable in the X-axis direction.

The three component-mounting units 400 are identical in construction with the three component-mounting units 150 provided in the first embodiment, except in that the right and left units 400 are movable relative to the intermediate unit 400 in the X-axis direction, so that the distances between the axes of rotation of the nozzle holders 202 are adjustable. Each component-mounting unit 400 includes a main body 404 on which are mounted a suction nozzle 430, the nozzle holder 202, the nozzle-holder elevating and lowering device 204 and the nozzle-holder rotating device 207. The intermediate component-mounting unit 400 is fixed at its main body 404 to the X-axis slide. The main bodies 404 of the right and left component-mounting units 400 are provided with respective guide blocks 406. The right and left component-mounting units 400 are slidable at their guide blocks 406 on respective guide rails 408 provided on the X-axis slide 164 so as to extend in the X-axis direction. These guide blocks 406 and guide rails 408 constitute a guiding device 410. The suction nozzle 430 includes a suction tube 432, and a nozzle body 434 by which the suction tube 432 is held coaxially or concentrically such that a lower sucking end face 436 of the suction tube 432 is aligned with the axis of rotation of the nozzle holder 202. Thus, a sucking portion in the form of the suction tube 432 of the suction nozzle 430 is concentric with the nozzle holder 202.

Figure 19:
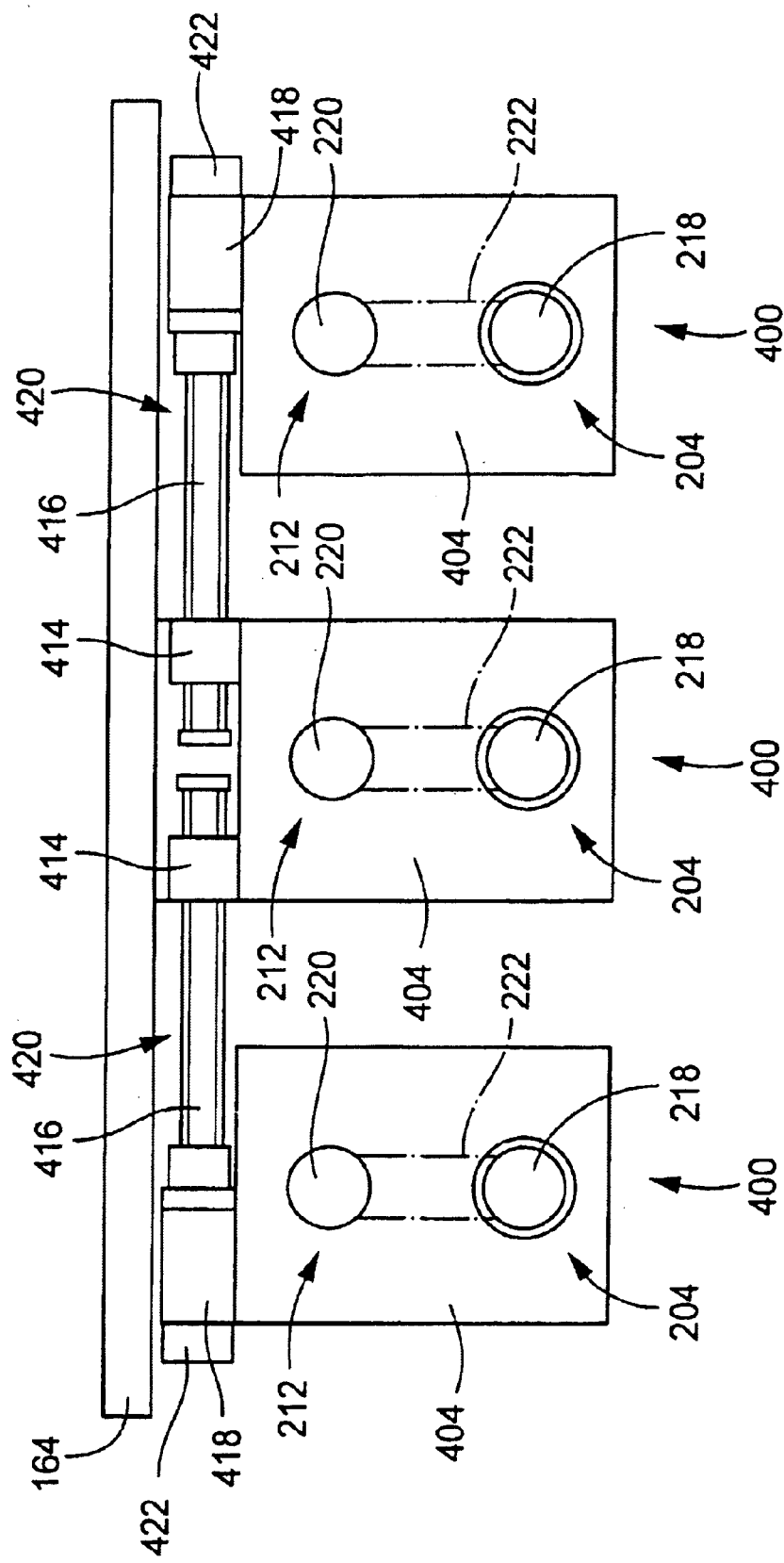
FIG. 19 is a plan view of the component-mounting device of FIG. 17.

As shown in FIG. 19, the main body 404 of the intermediate component-mounting unit 400 is provided with two ballnuts 414 fixed thereto such that the axes of the ballnuts 414 are parallel to the X-axis direction, and are neither rotatable nor axially movable relative to the main body 404. Two feedscrews in the form of ballscrews 416 are held in meshing engagement with the respective two ballnuts 414. The main bodies 404 of the right and left component-mounting units 400 are provided with respective spacing-distance adjusting motors 418, by which the respective ballscrews 416 are rotated. In the present embodiment, these spacing-distance adjusting motors 418 are servomotors which are fixed to the main bodies 404 and which serve as drive sources. The ballscrews 416 are rotatable relative to the main bodies 404 provided with the motors 418, but are not axially movable relative to the main bodies 404. In this arrangement, the right and left component-mounting units 400 are moved in the X-axis direction while being guided by the guiding devices 410, when the respective ballscrews 416 are rotated by the respective spacing-distance adjusting motors 418, so that the nozzle holders 202 of the right and left component-mounting units 400 are moved in the X-axis direction, whereby the distance between the axis of the nozzle holder 202 of each of the right and left units 400 and the axis of the nozzle holder 202 of the intermediate unit 400 can be adjusted. Thus, the distances between the axes of the adjacent suction nozzles 430 (distances between the axes of the adjacent nozzle holders 202) can be adjusted to adjust the distances between the centers of the sucking end faces 436 of the adjacent suction nozzles 430. In the present embodiment, the ballscrews 416, ballnuts 414 and spacing-distance adjusting motor 418 constitute a major portion of a nozzle-holder moving device 420 operable to move the nozzle holders 202 of the right and left component-mounting units 400 in the X-axis direction, and also constitute a major portion of a spacing-distance adjusting device operable to adjust the distances between the axes of the suction nozzles 430 or nozzle holders 202. The angle of operation of each axis-to-axis adjusting motor 418 is detected by an encoder 422, an output signal of which is applied to a computer of a control device (not shown).

Like the first embodiment, the present second embodiment is arranged to detect the positioning errors of the axes of rotation of the nozzle holders 202, the positioning errors of the centers of the sucking end faces 436 and the errors of the component-supply positions of the feeders 40, before an operation to mount the electronic components 20 on the printed-wiring board 14. In the present embodiment wherein the suction tubes 432 are concentric with the nozzle bodies 434 of the suction nozzles 430, the positioning errors of the centers of the sucking end faces 436 with respect to the axes of rotation of the respective nozzle holders 202 are due to manufacturing errors of the nozzle holders 202 and the suction nozzles 430.

To detect the positioning errors of the axes of rotation of the nozzle holders 202, the three component-mounting units 400 are moved to the position of one of the two component cameras 282, and images of the sucking end face 436 of each suction nozzle 430 are taken at the predetermined two angular positions of the suction nozzle 430, as in the first embodiment. At this time, the right and left component-mounting units 400 are located at their zero positions predetermined on the X-axis slide 164 in the X-axis direction. These zero positions of the right and left component-mounting units 400 and the position of the intermediate component-mounting units 400 are spaced from each other in the X-axis direction with a predetermined spacing pitch, which is equal to a multiple of the spacing pitch of the feeders 40. The zero positions of the right and left units 400 can be detected on the basis of the output signals of the encoders 422 provided to detect the angles of operation of the adjusting motors 418. For instance, the two images of the sucking end face 436 of each suction nozzle 430 are respectively taken at the angular zero position and the angular position which is spaced by 180° from the angular zero position. To detect the positioning errors of the center of the sucking end face 436 of each suction nozzle 430, the suction nozzle 430 is held by the nozzle holder 202 placed at its angular zero position, and an image of the sucking end face 436 is taken. Positioning errors of the center of the sucking end face 436 with respect to the axis of rotation of the nozzle holder 202 are obtained as the center position errors of the sucking end face 436, on the basis of image data indicative of the image of the sucking end face 436.

When the three suction nozzles 200 are simultaneously operated to receive the electronic components 20 from the respective three feeders 40, the centers of the sucking end faces 436 must be aligned with the actual component-supply positions of the feeders 40, in the X-axis and Y-axis directions, so that the sucking end faces 436 are aligned with the positions of the electronic components 20 supplied from the feeders 40. Initially, the positions of the XY robot 152 in the X-axis and Y-axis directions are controlled such that the center of the sucking end face 436 of the suction nozzle 200 of the intermediate component-mounting unit 400 is aligned with the component-supply position of the corresponding feeder 40. Positioning data for moving the X-axis slide 164 and the Y-axis slide 160 of the XY robot 152 are prepared such that the nominal X-axis and Y-axis positions of the axis of rotation of the nozzle holder 202 of the intermediate component-mounting unit 400 are aligned with the component-supply position. The thus prepared positioning data are adjusted for compensation for the detected positioning errors of the rotation axis of the nozzle holder 202 and the center position errors of the sucking end face 436 of the suction nozzle 430 of the intermediate component-mounting unit 400, and for the detected error of the component-supply position of the corresponding feeder 40 in the X-axis and Y-axis directions. The X-axis slide 164 and the Y-axis slide 160 are moved according to the thus adjusted positioning data, so that the center of the sucking end face 436 is aligned with the electronic component 20 at the component-supply position of the corresponding feeder 40 in the X-axis and Y-axis directions. At this time, the nozzle holder 202 is placed in its angular zero position.

For positioning the suction nozzles 430 of the right and left component-mounting units 400, the corresponding nozzle holders 202 are moved in the X-axis direction by the respective nozzle-holder moving devices 420, on the basis of not only the positioning errors of the corresponding feeders 40 and the positioning errors of the rotation axes of the corresponding nozzle holders 202 and sucking end faces 436, but also the corresponding positioning errors where were detected with respect to the intermediate component-mounting unit 400 to align the center of its sucking end face 436 with the component-supply position of the corresponding feeder 40. As a result of the movements of the nozzle holders 202 of the right and left component-mounting units 400 by the nozzle-holder moving devices 420, the centers of the corresponding sucking end faces 436 are aligned with the component-supply positions of the corresponding feeders 40 in the X-axis direction, so that the centers of the sucking end faces 436 of the three suction nozzles 430 are aligned with the actual component-supply positions of the corresponding feeders 40, with adjustments of the distances between the rotation axes of the adjacent nozzle holders 202. These adjustments are made while the nozzle holders 202 are placed in their angular zero positions, and are initiated when the nozzle holders 202 of the right and left component-mounting units 400 are located at the predetermined zero positions described above. After the suction nozzles 430 have received the electronic components 20 from the component-supplying device 24, 26, the nozzle holder 202 are returned to their zero positions in the X-axis direction before the images of the electronic components 20 are taken. After the electronic components 20 have been transferred from the suction nozzles 430 onto the printed-wiring board 14, the nozzle holders 202 are returned to their angular zero positions, so that the nozzle holders 202 are placed in their angular zero positions and located at their zero positions in the X-axis direction, before the suction nozzles 430 receive the next electronic components 20. Thus, the next adjustments of the distances between the rotation axes of the adjacent nozzle holders 20 in the X-axis direction are initiated while the nozzle holders 202 are placed in the angular zero positions and located at the X-axis zero positions.

For the right and left component-mounting units 400, the sucking end faces 436 are aligned with the component-supply positions of the feeders 40 in the Y-axis direction, by adjusting the positions at which the electronic components are stopped by the feeders 40. These adjustments in the Y-axis direction are made on the basis of not only the positioning errors in the Y-axis direction of the rotation axes of the nozzle holders 202, sucking end faces 436 and component-supply portions 122 of the feeders 40 corresponding to the right and left component-mounting units 400, but also the corresponding positioning errors where were detected with respect to the intermediate component-mounting unit 400 to align the center of its sucking end face 436 with the component-supply position of the corresponding feeder 40 in the Y-axis direction. After the adjustments of the distances between the rotation axes of the adjacent nozzle holders 202 in the X-axis direction and the adjustments of the actual component-supply positions of the corresponding feeders 40 in the Y-axis direction, the three suction nozzles 430 are lowered to simultaneously hold the electronic components 20 located at the component-supply positions.

After the suction nozzles 430 have held the electronic components 20 by suction, the suction nozzles 430 are elevated, and the nozzle holders 202 of the right and left component-mounting units 400 are returned to their zero positions in the X-axis direction. As in the first embodiment, the images of the three electronic components 20 are taken one after another, and the electronic components 20 are sequentially mounted on the printed-wiring board 14, at the respective component-mounting spots the positions of which are adjusted for compensation for the horizontal and angular positioning errors of the electronic components 20 which have been obtained on the basis of their images taken. In the present second embodiment, the adjustments of the distances between the rotation axes of the adjacent nozzle holders 202 in the X-axis direction to align the sucking end faces 436 with the feeders 40 in the X-axis direction do not cause the centers of the sucking end faces 436 to be displaced relative to the component-supply positions in the Y-axis direction.

Figure 20:
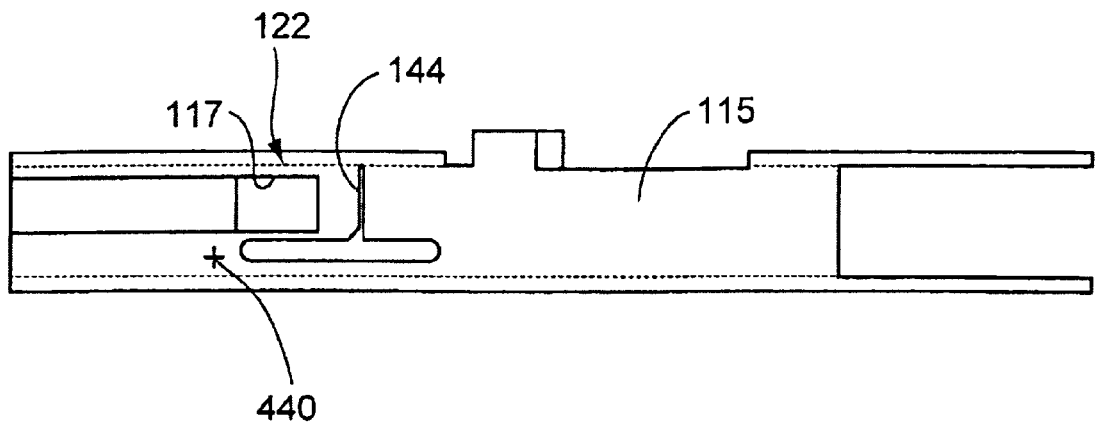
FIG. 20 is a view for explaining a manner of detecting the positioning error of the component-supply portion of the feeder, in a further embodiment of this invention.

In the first and second embodiments, the X-axis positions of the component-supply portions 122 of the feeders 40 at which the electronic components 20 are stopped are detected by using the gauge tapes 350. However, the use of the gauge tapes 350 is not essential for the detection of the X-axis positions of the component-supply portions 122. For instance, the gauge tapes 350 may be replaced by fiducial marks 440 provided on the covering members 115 disposed to cover the portions of the carrier tapes 50 adjacent to the component-supply portions 122, as shown in FIG. 20. To detect the error of the component-supply position of each feeder 40 in the X-axis direction, an image of the fiducial mark 440 is taken by the fiducial-mark camera 274. The fiducial mark 440 is located near the opening 117 formed in the covering member 115. The fiducial mark 440 may have any shape, such as a crisscross shape as in the embodiment of FIG. 20, a circular shape, or a polygonal shape such as a triangular, square or rectangular shape. The fiducial mark 440 may be formed on the covering member 115 by printing, or may be provided by bonding a printed label to the covering member 115, or by forming a raised or recessed portion on or in the covering member 115. In any case, the fiducial mark 440 has an optical characteristic different from that of the surrounding surface area of the covering member 115, so that the image of the fiducial mark 440 taken by the fiducial-mark camera 374 can be distinguished from the image of the surrounding surface area.

When the images of the fiducial marks 440 are taken, the fiducial-mark camera 274 is moved according to positioning data, which are prepared such that the center of the imaging area of the fiducial-mark camera 274 is located at the nominal position of the center of each fiducial mark 440. Image data indicative of the images of the fiducial marks 440 are processed to obtain positioning errors of the centers of the fiducial marks 440 with respect to the center of the imaging area of the fiducial-mark camera 274. The thus obtained positioning errors of the fiducial marks 440 are errors of positioning with respect to their nominal positions in the X-axis and Y-axis directions. As described above, each fiducial mark 440 is located near the opening 117 of the covering member 115, and near the component-supply portion 122 of the feeder 40, so that the positioning errors of the fiducial mark 440 may be considered as the positioning errors of the component-supply portion 122 of the feeder 40. Where the covering member 115 is not provided, the fiducial mark 440 may be provided on the body of the feeder 40.

Figure 21:
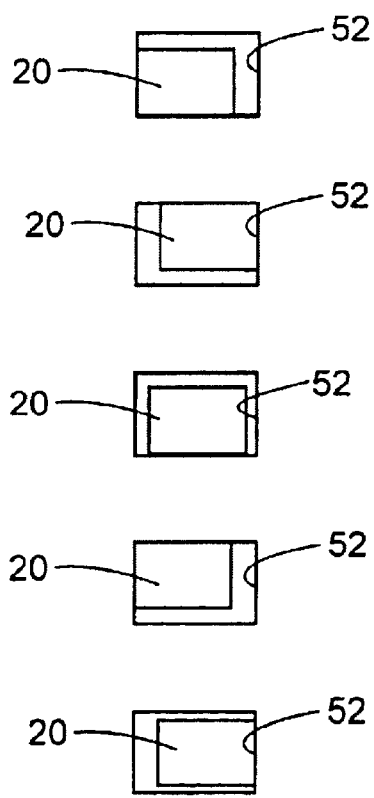
FIG. 21 is a view for explaining a manner of detecting the positioning error of the component-supply portion of the feeder, in a still further embodiment of this invention.

The positioning errors of the component-supply portions 122 of the feeders 40 may be detected by imaging the electronic components 20 which have been moved to the component-supply positions by feeding movements of the carrier tapes 50. Each electronic component 20 is accommodated within the component-accommodating recess 52, with some amounts of clearance or gap therebetween. In the presence of this clearance or gap, the positions of the electronic components 20 as accommodated within the respective recesses 52 are usually different from each other, as indicated in FIG. 21 by exaggeration.

To detect the positions of the component-supply portion 122 of each feeder 40 in the X-axis and Y-axis directions, the images of the two or more electronic components 20 accommodated-within the recesses 52 of the carrier-tape 50 are taken by the fiducial-mark camera 274. To this end, the fiducial mark camera 274 is positioned according to predetermined positioning data, such that the center of the imaging area of the fiducial-mark camera 274 is aligned with the nominal component-supply position of the feeder 40. The image of the electronic component 20 located in the component-supply portion 122 is taken. Each time the image of the electronic component 20 in the component-supply portion 122 is taken, the carrier tape 50 is fed by a distance corresponding to the spacing distance of the electronic components 20. Thus, the image of the plurality of electronic components 20 are taken, and image data indicative of the images are processed to obtain the positioning errors of the centers of the electronic components 20 with respect to the center of the imaging area of the fiducial-mark camera 274 in the X-axis and Y-axis directions, and to calculate the average values of the positioning errors of the electronic components 20 in the X-axis and Y-axis directions. The calculated average values are used as the X-axis and Y-axis errors of the component-supply position of each feeder 40. Namely, the average values of the center positions of the images of the electronic components 20 are considered to represent the positions of the component-supply portion 122, and therefore the average values of the positioning errors of the electronic components 20 with respect to the center of the imaging area of the fiducial-mark 274 are considered to represent the positioning errors of the component-supply portion 122 in the X-axis and Y-axis directions.

Figure 22A:
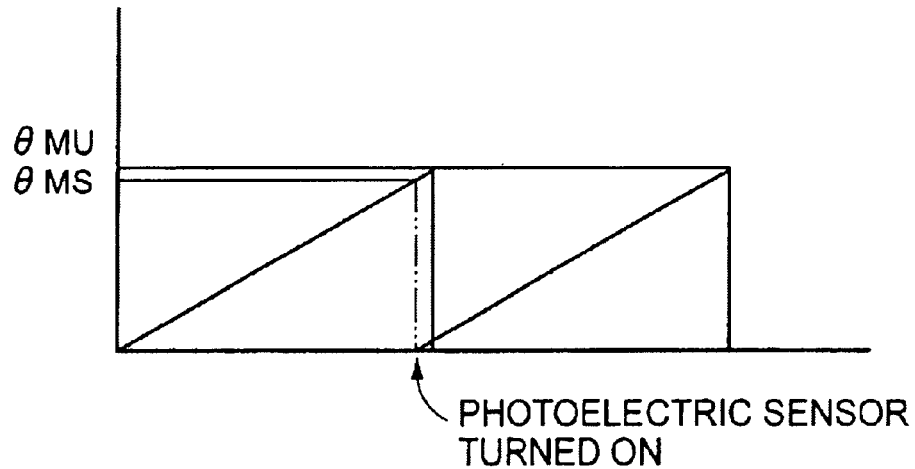
FIG. 22 are views for explaining a manner of correcting an error of feeding of the carrier tape by the tape feeding device of the feeder, in a yet further embodiment of this invention.
Figure 22B:
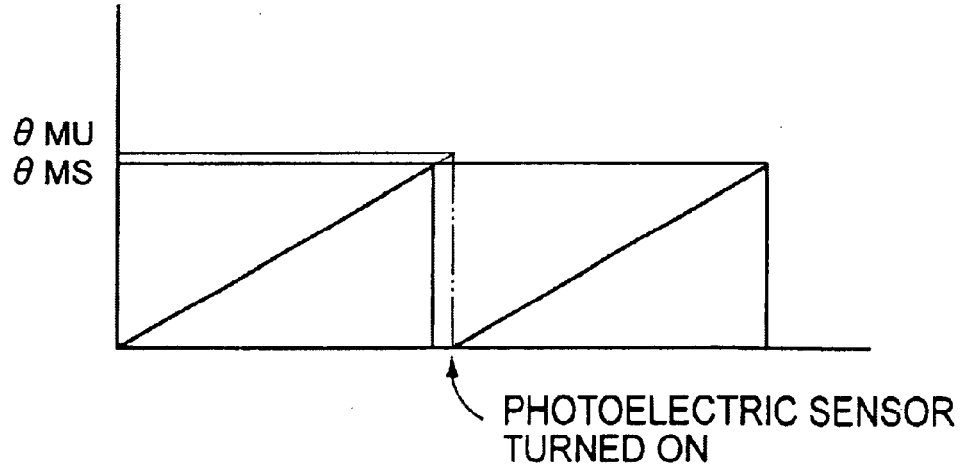

The feeding error of the carrier tape 50 by each carrier-tape feeding device 66 may be detected to adjust the actual component-supply position of the feeder 40, each time the carrier tape 50 is fed by the predetermined distance corresponding to the spacing pitch of the electronic components 20. For instance, the sprocket wheel 112 may be rotated by an angle larger than an angle corresponding to the predetermined angle of operation of the stepping motor 100 for each intermittent feeding motion of the carrier tape 50. In this case, the photoelectric sensor 124 is turned from the OFF state to the ON state before the angle of operation of the stepping motor 100 has reached the predetermined nominal value θMU, that is, when the angle of operation has reached a value θMS smaller than the nominal value θMU, as indicated in FIG. 22A. In this case, the carrier tape 50 is fed by a distance larger than the distance corresponding to the spacing pitch of the electronic components 20. When the next intermittent feeding action of the carrier tape 50 is effected to feed the next electronic component 20 to the component-supply position, the angle θMS at which the photoelectric sensor 124 is turned ON is set as the angular zero position of the stepping motor 100. Where the sprocket wheel 112 is rotated by an angle smaller than the angle corresponding to the predetermined angle of operation of the stepping motor 100, on the other hand, the photoelectric sensor 124 is turned from the OFF state to the ON state after the stepping motor 100 has been operated by the predetermined nominal angle θMU, that is, when the angle of operation has reached a value θMS larger than the nominal value θMU, as indicated in FIG. 22B. In this case, the carrier tape 50 is fed by a distance smaller than the distance corresponding to the spacing pitch of the electronic components 20. When the next intermittent feeding action of the carrier tape 50 is effected to feed the next electronic component 20 to the component-supply position, the angle θMS at which the photoelectric sensor 124 is turned ON is set as the angular zero position of the stepping motor 100.

In the first embodiment of FIGS. 1–16, the center of the sucking end face 254 is displaced in the Y-axis direction as a result of rotation of the suction nozzle 200 to turn the sucking end face 254 about the axis of rotation of the nozzle holder 202, for alignment of the center of the sucking end face 254 with the component-supply position of the feeder 40 in the X-axis direction, and the angle of operation of the stepping motor 100 is adjusted for aligning the actual component-supply position with the displaced center of the sucking end face 254 in the Y-axis direction. However, this adjustment of the stepping motor 100 is not essential, for example, where the amount of displacement of the sucking end face 254 in the Y-axis direction as a result of its turning movement is not so large.

Figure 23:
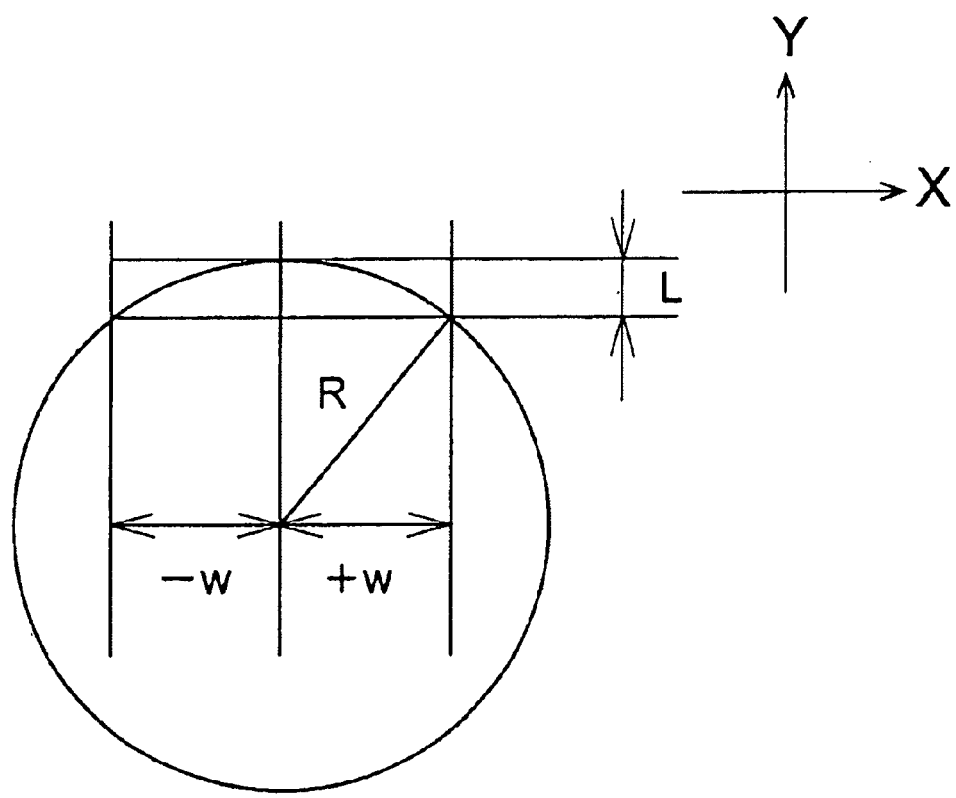
FIG. 23 is a view for explaining a manner of setting an amount of eccentricity of the sucking end face of the suction nozzle, when a distance between the rotation axis of this suction nozzle and that of the adjacent suction is adjusted by turning the sucking end face, where correction of a positioning error of the sucking end face in the Y-axis direction due to the turning of the sucking end face is not required.

To move the sucking end face 254 by a distance of w in the positive or negative X-axis direction, the sucking end face 254 turned along a circle whose center lies on the axis of rotation of the nozzle holder 202 and whose radius R is equal to a distance between the axis of rotation of the suction nozzle 200 and the axis of rotation of the sucking end face 254, as indicated in FIG. 23. In this case, the center of the sucking end face 254 is displaced by a distance L in the Y-axis direction, as also indicated in FIG. 23. This distance L of displacement changes with the radius R of the turning path of the sucking end face 254. Accordingly, a permissible upper limit of the distance L can be determined by the radius R, that is, the distance between the axes of rotation of the suction nozzle 200 and the nozzle holder 202. For instance, the permissible upper limit of the distance L is determined to be three, five or ten times the radius R. If the radius R is smaller than a permissible upper limit corresponding to the permissible upper limit of the distance L, it is not necessary to make the adjustment of the operating angle of the stepping motor 100 for aligning the component-supply position of the feeder 40 with the sucking end face 254 in the Y-axis direction, after the adjustment of the position of the sucking end face 254 in the X-axis direction by rotating the suction nozzle 200.

The illustrated embodiments are all arranged to detect the positioning errors of the rotation axis of the nozzle holder, the eccentricity values of the sucking end face and the errors of the component-supply position prior to the initiation of the component-mounting operation, the detection may be effected to make the appropriate adjustments when a predetermined condition is satisfied during the component-mounting operation, for example, when the component-mounting operation has been performed for a predetermined time, when the number of the printed-wiring boards 14 on which the electronic components 20 have been mounted has increased to a predetermined value, or when the number of the electronic components 20 which has been supplied from the feeder 40 has increased to a predetermined value.

In the illustrated embodiments, the feeders 40 are equally spaced apart from each other in the X-axis direction with the predetermined spacing pitch. However, the feeder holding devices 78 may be arranged such that the spacing distance between the adjacent feeders 40 may be changed as desired, for instance, in increments of a predetermined minimum distance, so that the spacing distance between one pair of adjacent feeders 40 may be different from the spacing distance between another pair of adjacent feeders 40, provided those spacing distances are equal to a multiple of the predetermined minimum distance.

In the first embodiment wherein the suction tube 252 is eccentric with respect to the nozzle holder 202, the angular zero position of the nozzle holder 202 is mechanically detected upon determination of the angle and direction of rotation of the suction nozzle 200 required to align the sucking end face 254 with the component-supply position of the feeder 40 in the X-axis direction. However, the angular zero position may be detected on the basis of the output signal of the encoder 320 provided to detect the angular positions of the nozzle-holder rotating motor 240 and the nozzle holder 202. In this case, the output signal of the encoder 320 indicating the actual angular position of the nozzle holder 202 is compared with stored data indicative of the angular zero position of the nozzle holder 202.

In the first embodiment wherein the suction tubes 252 of the three suction nozzles 200 are eccentric with respect to the nozzle holders 202, the distance of movement of the movable member in the form of the X-axis slide 164 in the Y-axis direction is adjusted for compensation of the positioning errors associated with the intermediate component-mounting unit 400, when the sucking end faces 254 turned about the axes of rotation of the suction nozzles 200, for alignment with the component-supply positions of the feeders 40 in the X-axis direction when the suction nozzles 200 receive the electronic components 20. However, the adjustment of the distance of movement of the X-axis slide 164 is not essential. In this case, the sucking end faces 254 and the component-supply positions of the feeders 40 (electronic components at the component-supply portions 122) are aligned with each other in the X-axis direction, by the turning movements of the sucking end faces 254 and the adjustment of the stepping motors 100 to adjust the actual component-supply positions.

The first embodiment may be modified such that one of the suction nozzles has the suction tube concentric with the nozzle holder. In this case, the suction nozzle having the concentric suction tube is moved in the Y-axis direction to align the center of the sucking end face with the actual component-supply position of the corresponding feeder 40, and the sucking end faces of the other suction nozzles are turned to adjust the distances between the axes of rotation of the adjacent suction nozzles in the X-axis direction.

In the first embodiment, the suction tube 252 is made eccentric with respect to the nozzle holder 202 by forming the suction nozzle 200 such that the suction tube 252 is eccentric with the nozzle body 250. However, the portion of the nozzle holder 202 at which the nozzle body 250 is held by the nozzle holder 202 may be made eccentric with respect to the axis of rotation of the nozzle holder 202 by the nozzle-holder rotating motor 240.

Figure 17:
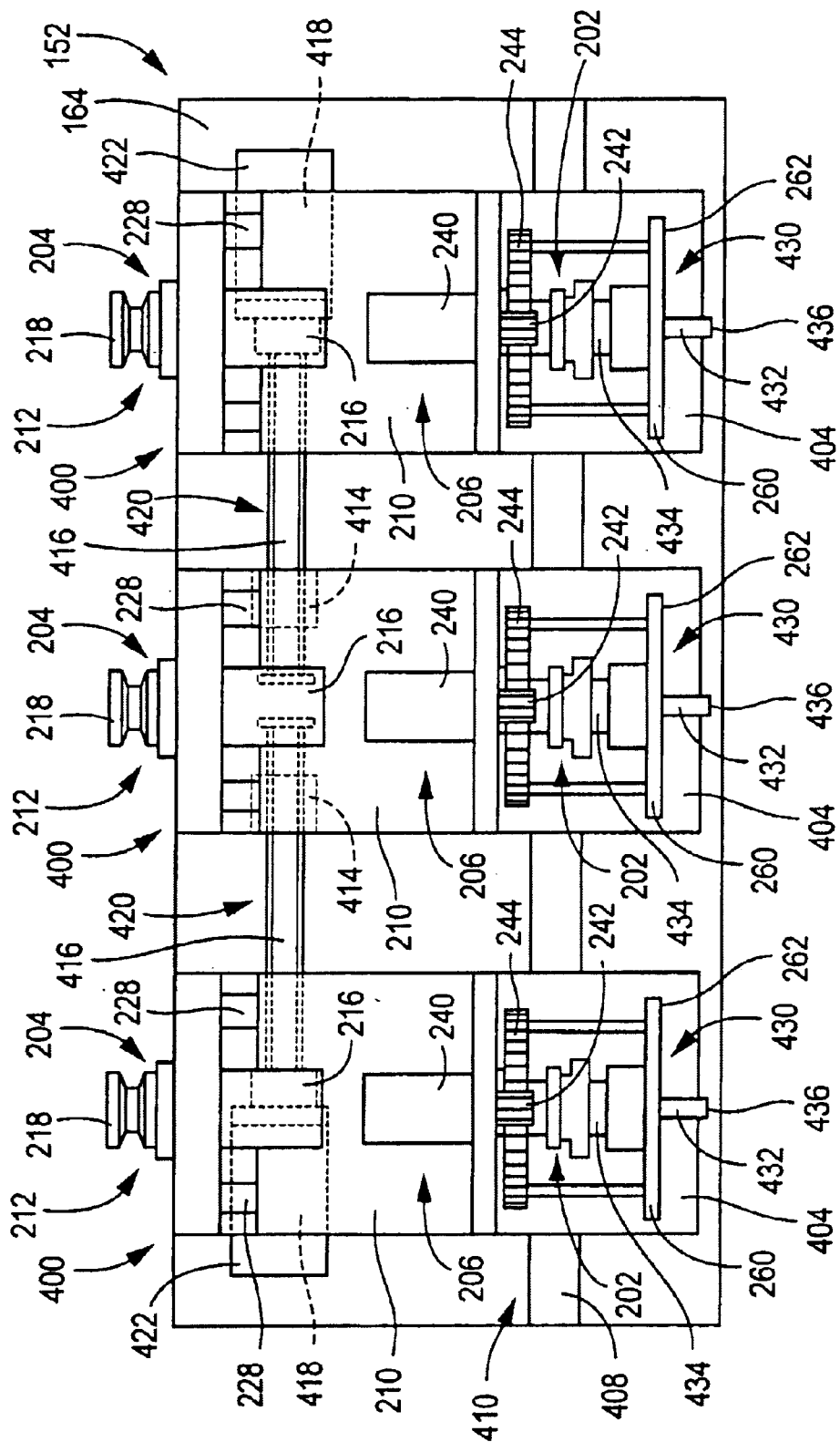
FIG. 17 is a side elevational view of a component-mounting device in an electric-component mounting system according to another embodiment of this invention.
Figure 18:
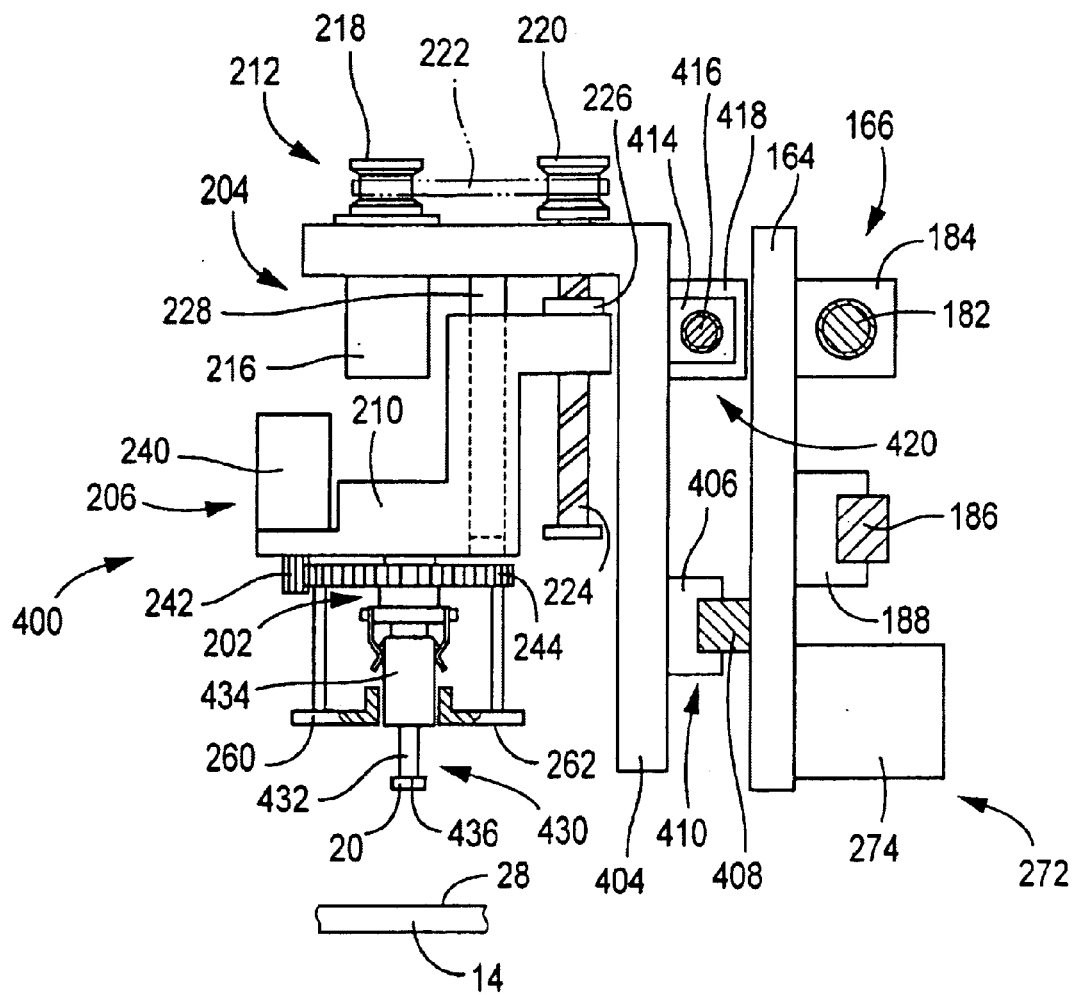
FIG. 18 is a front elevational view partly in cross section of the component-mounting device of FIG. 17.

In the second embodiment of FIGS. 17–19 wherein the nozzle holders 202 of the right and left component-mounting units 400 are moved in the X-axis direction to adjust the distances between the axes of rotation thereof, the nozzle-holder moving devices 420 including the ballscrews 416 and ballnuts 414 may be replaced by nozzle-holder moving devices of other types, each of which includes a rack-and-pinion mechanism, a link mechanism or a cam mechanism, for instance.

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An electric-component mounting system for mounting electric components on a circuit substrate, comprising:
   a circuit-substrate holding device operable to hold said circuit substrate;
   a feeder holding device which holds a plurality of feeders each operable to feed said electric components in a row to a component-supply portion thereof one after another, such that the electric components are fed by each of said feeders in a feeding direction parallel to a first straight line on a reference plane parallel to a component-mounting surface of said circuit substrate as held by said circuit-substrate holding device, and such that said component-supply portions of the feeders are arranged in a direction parallel to a second straight line on said reference plane, which second straight line intersects said first straight line;
   a movable member which is movable in said reference plane and which holds a plurality of nozzle holders for holding said plurality of suction nozzles, respectively, such that said nozzle holders are arranged in said direction of arrangement of said plurality of feeders and such that each of selected ones of said plurality of nozzle holders is rotatable about an axis of rotation thereof perpendicular to said reference plane, each of asid selected ones of said plurality of suction nozzles including a fixing portion at which the suction nozzle is held by the the corresponding nozzle holder, and a sucking portion which is operable to hold the electric component and which is excentric with respect to said axis of rotation of said each nozzle holder;

a spacing-distance adjusting device operable to adjust a distance between the sucking portions of adjacent ones of said selected ones of said plurality of suction nozzles in said direction of arrangement of said plurality of feeders, said spacing-distance adjusting device including a plurality of nozzle-holder rotating devices operable to rotate said selected ones of said nozzle holders independently of each other to respective desired angular positions thereof; and a component-holding control device operable to control said plurality of nozzle-holder rotating devices of said spacing-distance adjusting device, for adjusting a relative position in said direction of arrangement of said feeders, between each of said selected suction nozzles and the electric component located in said component-supply portion of the feeder corresponding to said each selected suction nozzle, so as to permit said sucking portions of said selected suction nozzles to simultaneously hold by suction the respective electric components located in the respective component-supply portions of the feeders corresponding to said selected suction nozzles.

2. An electric-component mounting system according to claim 1, further comprising a component-supply-position adjusting device operable to adjust a component-supply position of each of said feeders at which one of said electric components in said row is located in said component-supply portion in said feeding direction after each feeding action of said each feeder, and wherein said component-holding control device is operable to control said component-supply-position adjusting device, for adjusting a relative position in said feeding direction between each of said selected suction nozzles and the electric component located in said component-supply portion of the feeder corresponding to said each selected suction nozzle, so as to permit said sucking portions said selected suction nozzles to simultaneously hold by suction the respective electric components located in the respective component-supply portions of the feeders corresponding to said selected suction nozzles.

3. An electric-component mounting system according to claim 2, wherein each of said plurality of feeders includes a component feeding device operable to feed the electric components, said component feeding device including as a drive source an electric motor an angular position of which is controllable, and said component-supply-position adjusting device including an electric-motor control device operable to control the angular position of said electric motor at which an operation of said electric motor is stopped, whereby said component-supply position of said each feeder is adjusted.

4. An electric-component mounting system according to claim 1, wherein each of said plurality of feeders includes a tape-feeding device operable to feed a carrier tape in a longitudinal direction thereof, said carrier tape holding a succession of electric components arranged in said longitudinal direction.

5. An electric-component mounting system according to claim 1, further comprising:

a component-supply-portion recognizing device operable at a predetermined position thereof to recognize said component-supply portion of said each feeder and a portion surrounding said component-supply portion; and a component-supply-position obtaining device operable on the basis of at least an output signal of said component-supply-portion recognizing device, to obtain at least a position of said component-supply portion of said each feeder in said direction of arrangement of the plurality of feeders, and wherein said component-holding control device is operable to adjust said relative position between each of said selected suction nozzles and the electric component located in said component-supply portion of the corresponding feeder, on the basis of position which has been obtained by said component-supply-position obtaining device.

6. An electric-component mounting system according to claim 1, further comprising:

a sucking-portion recognizing device operable at a predetermined position thereof to recognize said sucking portion of each of said selected ones of said plurality of suction nozzles; and a sucking-position obtaining device operable on the basis of at least an output signal of said sucking-portion recognizing device, to obtain a position of said sucking portion, and wherein said component-holding control device is operable to adjust a relative position between each of said selected suction nozzles and the electric component located in said component-supply portion of the corresponding feeder, on the basis of at least the position of said sucking portion obtained by said sucking-position obtaining device.

7. An electric-component mounting system for mounting electric components on a circuit substrate, comprising:

a circuit-substrate holding device operable to hold said circuit substrate;

a feeder holding device which holds a plurality of feeders each operable to feed said electric components in a row to a component-supply portion thereof one after another, such that the electric components are fed by each of said feeders in a feeding direction parallel to a first straight line on a reference plane parallel to a component-mounting surface of said circuit substrate as held by said circuit-substrate holding device, and such that said component-supply portions of the feeders are arranged in a direction parallel to a second straight line on said reference plane, which second straight line intersects said first straight line;

a movable member which is movable in said reference plane and which holds a plurality of nozzle holders for holding said plurality of suction nozzles, respectively, such that said nozzle holders are arranged in said direction of arrangement of said plurality of feeders and such that selected ones of said nozzle holders which correspond to selected ones of said plurality of suction nozzles are movable in said direction of arrangement;

a spacing-distance adjusting device including a nozzle-holder moving device operable to move said selected ones of said nozzle holders in said direction of arrangement, for thereby adjusting a distance between axes of adjacent ones of said selected ones of said nozzle holders;

a component-supply-position adjusting device operable to adjust a component-supply position of each of said feeders at which one of said electric components in said row is located in said component-supply portion in said feeding direction after each feeding action of said each feeder; and a component-holding control device operable to control said nozzle-holder moving device of said spacing-distance adjusting device and said component-supply-position adjusting device, for adjusting a first relative position in said feeding direction of arrangement of said feeders and a second relative position in said feeding direction, between each of said selected suction nozzles and the electric component located in said component-supply portion of the feeder corresponding to said each selected suction nozzle, so as to permit said selected suction nozzles to simultaneously hold by suction the respective electric components located in the respective component-supply portions of the feeders corresponding to said selected suction nozzles.

8. An electric-component mounting system according to claim 7, wherein each of said plurality of feeders includes a component feeding device operable to feed the electric components, said component feeding device including as a drive source an electric motor an angular position of which is controllable, and said component-supply-position adjusting device including an electric-motor control device operable to control the angular position of said electric motor at which an operation of said electric motor is stopped, whereby said component-supply position of said each feeder is adjusted.

9. An electric-component mounting system according to claim 7, wherein each of said plurality of feeders includes a tape-feeding device operable to feed a carrier tape in a longitudinal direction thereof, said carrier tape holding a succession of electric components arranged in said longitudinal direction.

10. An electric-component mounting system according to claim 7, further comprising:

a component-supply-portion recognizing device operable at a predetermined position thereof to recognize said component-supply portion of said each feeder and a portion surrounding said component-supply portion; and a component-supply-position obtaining device operable on the basis of at least an output signal of said component-supply-portion recognizing device, to obtain a first position of said component-supply portion of said each feeder in said direction of arrangement of the plurality of feeders, and a second position of said component-supply portion in said feeding direction as said component-supply position, and wherein said component-holding control device is operable to adjust said first and second relative positions between each of said selected suction nozzles and the electric component located in said component-supply portion of the corresponding feeder, on the basis of at least said first and second positions which have been obtained by said component-supply-position obtaining device.

11. An electric-component mounting system according to claim 7, further comprising:

a sucking-portion recognizing device operable at a predetermined position thereof to recognize a sucking portion of each of said selected ones of said plurality of suction nozzles, which sucking portion is arranged to hold the corresponding electric component; and a sucking-position obtaining device operable on the basis of at least an output signal of said sucking-portion recognizing device, to obtain a position of said sucking portion, and wherein said component-holding control device is operable to adjust said at least one of said first and second relative positions between each of said selected suction nozzles and the electric component located in said component-supply portion of the corresponding feeder, on the basis of at least the position of said sucking portion obtained by said sucking-position obtaining device.

12. An electric-component mounting system for mounting electric components on a circuit substrate, comprising:

a circuit-substrate holding device operable to hold said circuit substrate;

a feeder holding device which holds a plurality of feeders each operable to feed said electric components in a row to a component-supply portion thereof one after another, such that the electric components are fed by each of said feeders in a feeding direction parallel to a first straight line on a reference plane parallel to a component-mounting surface of said circuit substrate as held by said circuit-substrate holding device, and such that said component-supply portions of the feeders are arranged in a direction parallel to a second straight line on said reference plane, which second straight line intersects said first straight line;

a movable member which holds a plurality of suction nozzles such that said suction nozzles are arranged in the direction of arrangement of said plurality of feeders and such that each of said suction nozzles is rotatable about an axis of rotation thereof perpendicular to said reference plane, said movable member being movable in said reference plane;

a component-supply-position adjusting device operable to adjust a component-supply position of each of said feeders at which one of said electric components in said row is located in said component-supply portion in said feeding direction after each feeding action of said each feeder; and a component-holding control device operable to control said component-supply-position adjusting device, for adjusting at least one of a relative position in said feeding direction between each of said selected suction nozzles and the electric component located in said component-supply portion of the feeder corresponding to said each selected suction nozzle, so as to permit said selected suction nozzles to simultaneously hold by suction the respective electric components located in the respective component-supply portions of the feeders corresponding to said selected suction nozzles.

13. An electric-component mounting system according to claim 12, wherein each of said plurality of feeders includes a component feeding device operable to feed the electric components, said component feeding device including as a drive source an electric motor an angular position of which is controllable, and said component-supply-position adjusting device including an electric-motor control device operable to control the angular position of said electric motor at which an operation of said electric motor is stopped, whereby said component-supply position of said each feeder is adjusted.

14. An electric-component mounting system according to claim 12, further comprising a spacing-distance adjusting device operable to adjust a distance between axes of adjacent ones of selected ones of said plurality of suction nozzles in said direction of arrangement of said plurality of feeders, and wherein said component-holding control device is operable to control said spacing-distance adjusting device, for adjusting a relative position in said direction of arrangement of said feeders, between each of said selected suction nozzles and the electric component located in said component-supply portion of the feeder corresponding to said each selected suction nozzle.

15. An electric-component mounting system according to claim 12, wherein said movable member holds a plurality of nozzle holders for holding said plurality of suction nozzles, respectively, such that said nozzle holders are arranged in said direction of arrangement of said plurality of feeders and such that each of selected ones of said plurality nozzle holders is rotatable about an axis of rotation thereof perpendicular to said reference plane, and wherein said spacing-distance adjusting device includes a plurality of nozzle-holder rotating devices operable to rotate said selected ones of said nozzle holders independently of each other to respective desired angular positions thereof.

16. An electric-component mounting system according to claim 12, wherein said movable member holds a plurality of nozzle holders for holding said plurality of suction nozzles, respectively, such that said nozzle holders are arranged in said direction of arrangement of said plurality of feeders and such that selected ones of said nozzle holders which correspond to said selected ones of said plurality of suction nozzles are movable in said direction of arrangement, and wherein said spacing-distance adjusting device includes a nozzle-holder moving device operable to move said selected ones of said nozzle holders in said direction of arrangement, for thereby adjusting a distance between axes of adjacent ones of said selected ones of said nozzle holders.

* * * * *